United States Patent
Danjo

(10) Patent No.: US 8,339,296 B2
(45) Date of Patent: Dec. 25, 2012

(54) AMPLIFYING CIRCUIT AND ANALOG-DIGITAL CONVERTING CIRCUIT INCLUDING SAME

(75) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 13/071,119

(22) Filed: Mar. 24, 2011

(65) Prior Publication Data

US 2011/0234440 A1 Sep. 29, 2011

(30) Foreign Application Priority Data

Mar. 26, 2010 (JP) .................................. 2010-073828
Jan. 28, 2011 (JP) .................................. 2011-017231

(51) Int. Cl.
*H03M 1/06* (2006.01)

(52) U.S. Cl. ........ 341/118; 330/261; 330/255; 330/252; 330/253; 331/16; 331/17; 331/25; 327/310; 327/307; 327/356; 327/156; 327/157; 455/260; 455/326; 455/299; 455/333; 455/313

(58) Field of Classification Search .......... 341/118–155; 330/9, 252, 253, 255, 261; 331/16–25; 327/91, 327/156, 157, 307, 310, 356; 445/299, 326, 445/260, 333, 323, 313
See application file for complete search history.

(56) References Cited

U.S. PATENT DOCUMENTS

| | | | | |
|---|---|---|---|---|
| 5,430,765 A * | 7/1995 | Nagahori | ....................... | 375/318 |
| 6,448,836 B2 * | 9/2002 | Kokubun et al. | ............... | 327/307 |
| 6,900,700 B2 * | 5/2005 | Oosawa et al. | .................. | 331/46 |
| 6,968,172 B2 * | 11/2005 | Saito | ............................. | 455/306 |
| 7,015,735 B2 * | 3/2006 | Kimura et al. | ................. | 327/157 |
| 7,050,779 B2 * | 5/2006 | Ono et al. | ...................... | 455/333 |
| 7,535,302 B2 * | 5/2009 | Nishimura et al. | ........... | 330/255 |

FOREIGN PATENT DOCUMENTS

JP 2001-111421 A 4/2001

* cited by examiner

*Primary Examiner* — Lam T Mai
(74) *Attorney, Agent, or Firm* — Arent Fox LLP

(57) ABSTRACT

An amplifying circuit includes a pair of MOS transistors; an amplifier that amplify a difference between potentials of differential output nodes coupled to drains of the pair of MOS transistors; cancel circuits that cause cancel current to flow to one of the differential output nodes when the amplifier amplifies a voltage between the differential output nodes and that shut off, after the amplifier performs the amplification operation, inflow of the cancel current; and a controller that performs setting so that a potential of first one of the differential input signals is equal to a potential of another one of the differential input signals, that compares, before the inflow of the cancel current, potentials generated at differential output nodes when the difference between potentials of the differential output nodes is amplified, and that sets the cancel current so that the potentials are reversed after the inflow of the cancel current.

12 Claims, 19 Drawing Sheets

FIG. 9

FIG. 11

AMPLIFYING CIRCUIT AND ANALOG-DIGITAL CONVERTING CIRCUIT INCLUDING SAME

CROSS REFERENCE TO RELATED APPLICATION

This application is based upon and claims the benefit of priority from the prior Japanese Patent Application NO. 2010-073828 filed on Mar. 26, 2010 and the prior Japanese Patent Application NO. 2011-17231 filed on Jan. 28, 2011, the entire contents of which are incorporated herein by reference.

FIELD

The embodiments discussed herein are related to an amplifying circuit having an offset correction function and an analog-to-digital converting circuit including the amplifying circuit.

BACKGROUND

In an analog-digital converting circuit, a comparator used for comparing voltages typically includes two MOS (metal oxide semiconductor) transistors having gate electrodes that receive first and second ones of different input signals, two current paths in which current controlled by the MOS transistors flows, and a latch unit that amplifies a difference between potentials of the current paths and that holds the amplified potential difference.

Thus, when the comparator has a difference in characteristics in the MOS transistors for controlling the current flowing in the current paths and a difference in characteristics in MOS transistors that constitute the latch unit, an offset occurs during the comparison of the voltages between the differential input signals.

In addition, characteristic differences also occur in MOS transistors belonging to another comparator. That is, offsets that occur in the comparators vary for each comparator, which means that variations occur in the offsets of the comparators.

When an analog-digital circuit realizes digitalization by using a configuration in which a plurality of serial resistances are used to divide a section between a ground voltage and a reference voltage into equally spaced voltage sections and to which of the voltage sections a voltage of an analog signal input using a plurality of comparators belongs is determined, the determination as to which of the voltage sections the voltage belongs varies at the boundaries of the voltage sections, in the presence of variations in offset values of the comparators.

Accordingly, in order to overcome the determination variations, Japanese Laid-open Patent Publication No. 2001-111421 discloses a cancel circuit for canceling an offset of a comparator. Japanese Laid-open Patent Publication No. 2001-111421 proposes a technology in which cancel current for canceling the offset is caused to flow to one of two current paths in the comparator.

The cancel current constantly flows in the current paths while an operation for comparing potentials of signals input to the comparator is performed. Hence, the amount of current consumed by the comparator including the cancel circuit increases compared to a comparator that does not include the cancel circuit.

SUMMARY

According to one aspect of the embodiments, there is provided an amplifying circuit including: a pair of NMOS transistors having gate electrodes that receive differential input signals; an amplifier that is electrically coupled to drains of the pair of NMOS transistors and a high-potential power-supply line to amplify a difference between potentials of differential output nodes electrically coupled to the corresponding drains of the pair of MOS transistors and to hold the amplified potential at the differential output nodes; offset cancel circuits that cause cancel current to flow to one of the differential output nodes when the amplifier amplifies a voltage between the differential output nodes and that shut off, after the amplifier performs the amplification operation, inflow of the cancel current to the differential output node in accordance with voltages of the drains of the pair of MOS transistors; and a threshold controller that performs setting so that a potential of a first one of the differential input signals is equal to a potential of another one of the differential input signals, that compares, before the inflow of the cancel current, potentials generated at the differential output nodes when the difference between the potentials of the differential output nodes is amplified, and that sets the cancel current so that the potentials are reversed after the inflow of the cancel current.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 5 is a graph illustrating the amount of offset correction for offset cancel units during an offset detection operation versus the number of switches turned on;

FIG. 9 is a circuit diagram illustrating a comparator of a fourth embodiment;

FIG. 11 is a circuit diagram illustrating a comparator of a sixth embodiment;

DESCRIPTION OF EMBODIMENTS

The present invention encompasses modifications in which design changes conceivable by those skilled in the art are made to embodiments described below and modifications in which elements discussed in the embodiments are recombined. The present invention also encompasses a configuration in which an element thereof is replaced with another element that provides the same effect and so on, and is not limited to the embodiments described below.

First Embodiment

Figure 1:
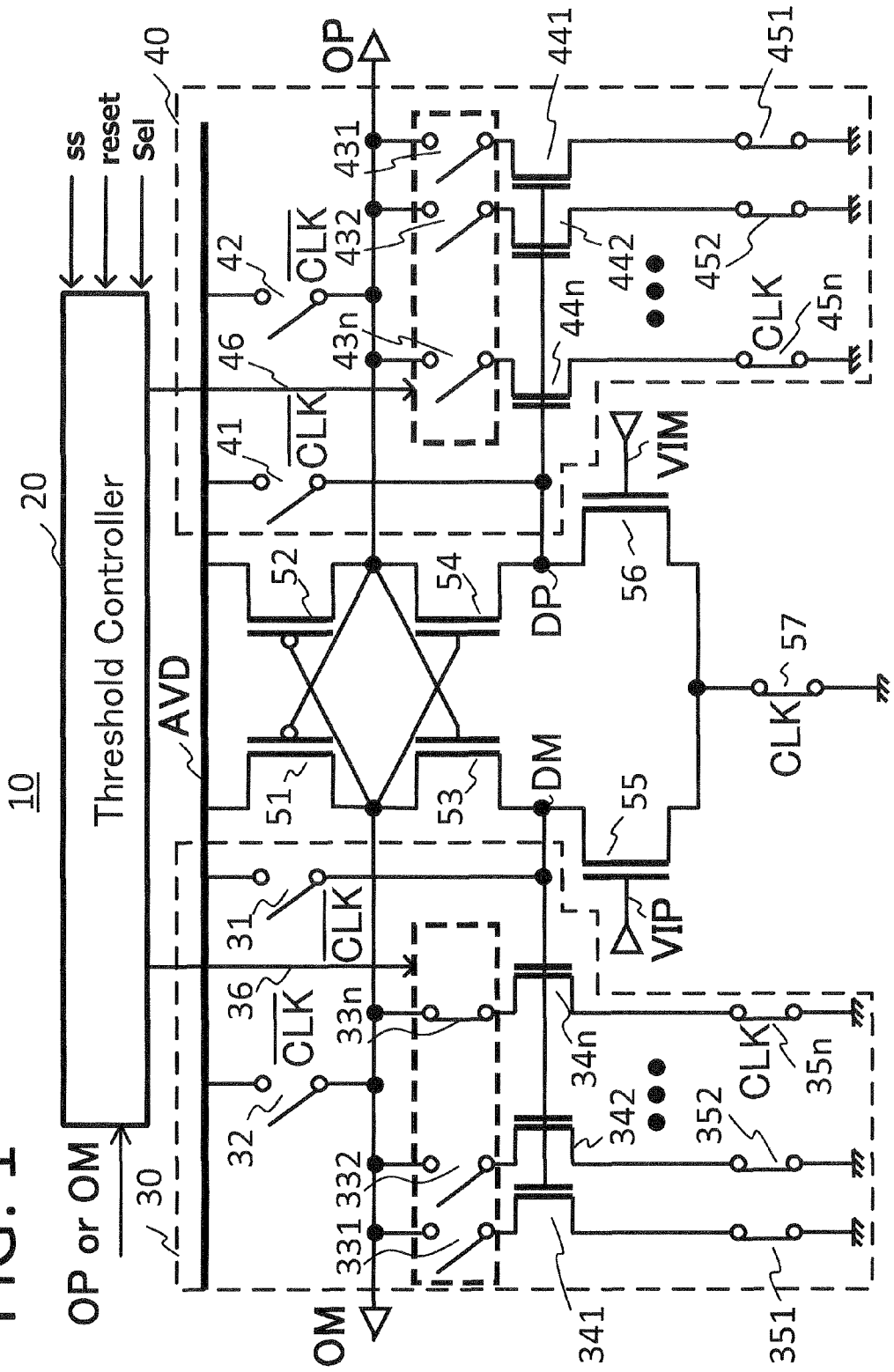
FIG. 1 is a circuit diagram illustrating a comparator of a first embodiment.

FIG. 1 is a circuit diagram illustrating a comparator 10 according to a first embodiment. The comparator 10 includes a threshold controller 20, an offset cancel unit 30, an offset cancel unit 40, positive-channel MOS (pMOS) transistors 51 and 52, negative-channel MOS (nMOS) transistors 53, 54, 55, and 56, and a switch 57.

The comparator 10 is capable of performing a comparison operation and an operation for calibrating an offset of the comparator 10. The comparison operation refers to an amplification operation for amplifying the voltages of first and second ones of given complementary input signals, setting the potential of the signal having a higher one of the voltages to logic "H (high)", and setting the potential of the signal having a lower one of the voltages to logic "L (low)". The calibration operation refers to an operation for detecting an offset resulting from a high-low voltage determination and setting the amount of cancel current corresponding to the offset.

The pMOS transistor 51 has a source coupled to a high-potential line AVD, a drain coupled to a drain of the nMOS transistor 53, and a gate coupled to a drain of the nMOS transistor 54. The drain of the pMOS transistor 51 is coupled to an output terminal via which an output signal OM is output.

The nMOS transistor 53 has a source coupled to a node DM and a gate coupled to the drain of the nMOS transistor 54.

The nMOS transistor 55 has a source coupled to a first electrode of the switch 57 and a gate coupled to a signal line through which an input signal VIP propagates.

Thus, the pMOS transistor 51, the nMOS transistor 53, and the nMOS transistor 55 are coupled in series between the high-potential line AVD and the switch 57 via the sources and the drains, to thereby form a first current path including the node DM. In accordance with the potential of the input signal VIP, the nMOS transistors control a current in the first current path to increase/reduce the current.

The pMOS transistor 52 has a source coupled to the high-potential line AVD, a drain coupled to the drain of the nMOS transistor 54, and a gate coupled to the drain of the nMOS transistor 53. The drain of the pMOS transistor 52 is coupled to an output terminal via which an output signal OP is output.

The nMOS transistor 54 has a source coupled to a node DP and a gate coupled to the drain of the nMOS transistor 53.

The nMOS transistor 56 has a source coupled to the first electrode of the switch 57 and a gate coupled to a signal line through which an input signal VIM propagates.

Thus, the pMOS transistor 52, the nMOS transistor 54, and the nMOS transistor 56 are coupled in series between the high-potential line AVD and the switch 57 via the sources and the drains, to thereby form a second current path including the node DP. In accordance with the potential of the input signal VIM, the nMOS transistors control a current in the second current path to increase/reduce the current.

In accordance with the potential of a clock signal CLK, the switch 57 connects or disconnects the sources of the nMOS transistors 55 and 56 and a ground line.

The transistors belonging to the first current path, the transistors belonging to the second current path, and the switch 57 amplify a difference between the potentials of nodes to which the output terminals of the output signals OM and OP are coupled, set the potential of the node having a higher one of the potentials to logic "H", and set the potential of the node having a lower one of the potentials to logic "L". Thus, the transistors belonging to the first current path, the transistors belonging to the second current path, and the switch 57 form a signal amplifier.

The offset cancel unit 30 serves as a circuit that controls, in accordance with the potential of the node DM and a code signal 36 including a digital signal from the threshold controller 20, cancel current flowing from the first current path to the ground line via the output terminal of the output signal OM.

The offset cancel unit 30 includes n switches 331, 332, . . . , 33n, n nMOS transistors 341, 342, . . . , 34n, n switches 351, 352, and 35n, and switches 31 and 32.

The n switches 331, 332, . . . , 33n have first ends coupled to the output terminal of the output signal OM and second ends coupled to corresponding drains of the nMOS transistors 341, 342, . . . , 34n. The nMOS transistors 341, 342, . . . , 34n have sources coupled to corresponding first ends of the switches 351, 352, . . . , 35n and gates coupled to the node DM. The switches 351, 352, . . . , 35n have second ends coupled to the ground line. The switch 32 connects or disconnects the output terminal of the output signal OM and the high-potential line AVD. The switch 31 connects or disconnects the node DM and the high-potential line AVD. The switches 31 and 32 execute the connections or disconnections in accordance with the potential of an inverted signal /CLK of the clock signal CLK. Thus, before the amplification operation is started, the output terminal of the output signal OM and the node DM have potentials that are equal to the potential of the high-potential line AVD. When the amplification operation is started, the output terminal of the output signal OM and, the node DM are disconnected from the high-potential line AVD.

The switches 351, 352, . . . , 35n execute connection or disconnection in accordance with the potential of the clock signal CLK. The clock signal CLK and the inverted signal /CLK thereof have logic states that are opposite to each other.

When the n switches 331, 332, . . . , 33n receive the code signal 36 output from the threshold controller 20 and constituted by a multi-bit digital signal, a number of n switches 331, 332, . . . , 33n which corresponds to a binary number expressed by the digital signal enter connected states and the other switches maintain disconnected states.

Thus, during the amplification of the voltage between the output terminal of the output signal OM, the output terminal being coupled to the node DM via the nMOS transistor 53, and the output terminal of the output signal OP, the output terminal being coupled to the node DP via the nMOS transistor 54, the offset cancel unit 30 causes the cancel current to flow to the output terminal of the output signal OM via the nMOS transistors 341, 342, . . . , 34n and the switches 331, 332, . . . , 33n that are in the connected states. The cancel current is current for canceling the offset of the comparator 10. After the voltage is amplified, since the potential of the node DM becomes substantially equal to the ground level, the nMOS transistors 341, 342, . . . , 34n are turned off to shut off the inflow of the cancel current.

The offset cancel unit 40 serves as a circuit that controls, in accordance with the potential of the node DP and a code signal 46 including a digital signal from the threshold controller 20, cancel current flowing from the second current path to the ground line via the output terminal of the output signal OP.

The offset cancel unit 40 includes n switches 431, 432, . . . , 43n, n nMOS transistors 441, 442, . . . , 44n, n switches 451, 452, and 45n, and switches 41 and 42.

The n switches 431, 432, . . . , 43n have first ends coupled to the output terminal of the output signal OP and second ends coupled to corresponding drains of the nMOS transistors 441, 442, . . . , 44n. The nMOS transistors 441, 442, . . . , 44n have sources coupled to corresponding first ends of the switches 451, 452, . . . , 45n and gates coupled to the node DP. The switches 451, 452, . . . , 45n have second ends coupled to the ground line. The switch 42 connects or disconnects the output terminal of the output signal OP and the high-potential line AVD. The switch 41 connects or disconnects the node DP and the high-potential line AVD. The switches 41 and 42 execute the connections or disconnections in accordance with the potential of the inverted signal /CLK of the clock signal CLK. Thus, before the amplification operation is started, the output terminal of the output signal OP and the node DP have potentials that are equal to the potential of the high-potential line AVD. When the amplification operation is started, the output terminal of the output signal OP and the node DP are disconnected from the high-potential line AVD.

The switches 451, 452, . . . , 45n execute connection or disconnection in accordance with the potential of the clock signal CLK. The clock signal CLK and the inverted signal /CLK thereof have logic states that are opposite to each other.

When the n switches 431, 432, . . . , 43n receive the code signal 36 output from the threshold controller 20 and constituted by a multi-bit digital signal, a number of n switches 431, 432, . . . , 43n which corresponds to a binary number expressed by the digital signal enter connected states and the other switches maintain disconnected states. Thus, similarly to the offset cancel unit 30, the offset cancel unit 40 also causes the cancel current to flow to the output terminal of the output signal OP when the amplification operation is started and shuts off the inflow of the cancel current after the amplification operation is completed.

Figure 2:
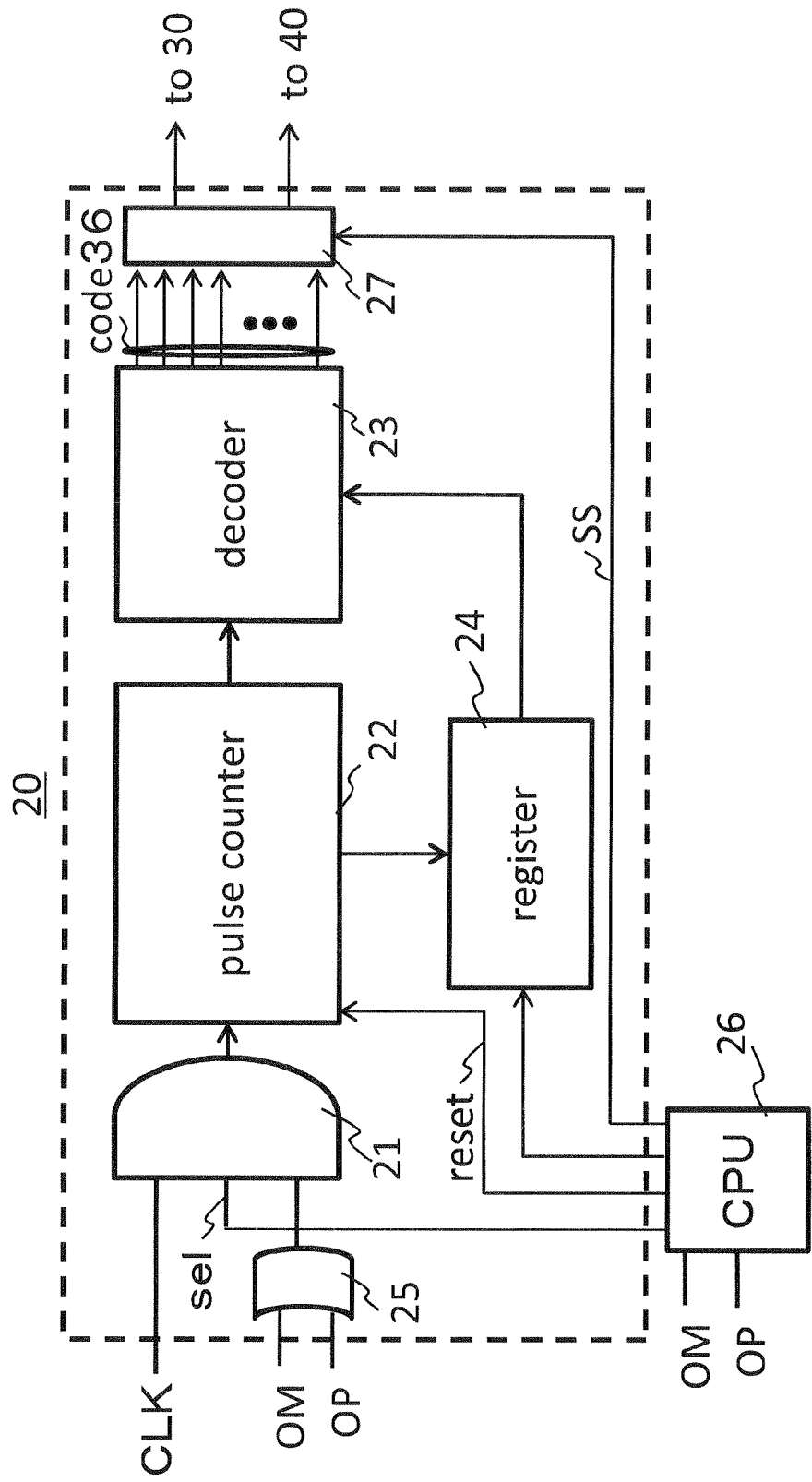
FIG. 2 is a diagram illustrating a threshold controller in the comparator of the first embodiment.

FIG. 2 is a diagram illustrating the threshold controller 20 in the comparator 10 of the first embodiment. The threshold controller 20 includes an AND circuit 21, a pulse counter 22, a decoder 23, a register 24, an OR circuit 25, and a signal supplying circuit 27.

A CPU (central processing unit) 26 outputs a correction signal "sel" whose logic becomes "H" during the calibration operation of the threshold controller 20. In response to the logic "H" output signal OM or OP output from the comparator 10, the OR circuit 25 outputs a resulting signal. In response to the correction signal "sel" output from the CPU 26 and the signal output from the OR circuit 25, the AND circuit 21 supplies the clock signal CLK to the pulse counter 22.

The pulse counter 22 is a circuit that counts clocks while the clock signal CLK is supplied from the AND circuit 21 thereto. When no clock signal CLK is supplied from the AND circuit 21, the pulse counter 22 outputs a count value at this point to the register 24 as a correction value "cal".

The decoder 23 is a circuit that outputs, in response to the correction value "cal" output from the register 24, a code signal corresponding to the correction value "cal".

The register 24 is a memory circuit that stores the correction value "cal" output from the pulse counter 22.

The OR circuit 25 outputs logic "H" when one of the signals OM and OP output from the comparator 10 is logic "H".

The CPU 26 serves as a control circuit for controlling an analog-digital circuit including the comparator 10. Typically, the control circuit may be implemented by a central processing device included in an LSI (large scale integration circuit) provided with the analog-digital circuit.

Accordingly, during normal operation of the comparator 10, the threshold controller 20 outputs the data, stored in the register 24, to the decoder 23 in response to a write instruction from the CPU 26. The decoder 23 decodes the data from the register 24 and outputs a resulting code signal to the offset cancel units 30 and 40.

On the other hand, when the comparator 10 performs the calibration operation, the threshold controller 20 performs an operation described below with reference to FIG. 3.

Figure 3:
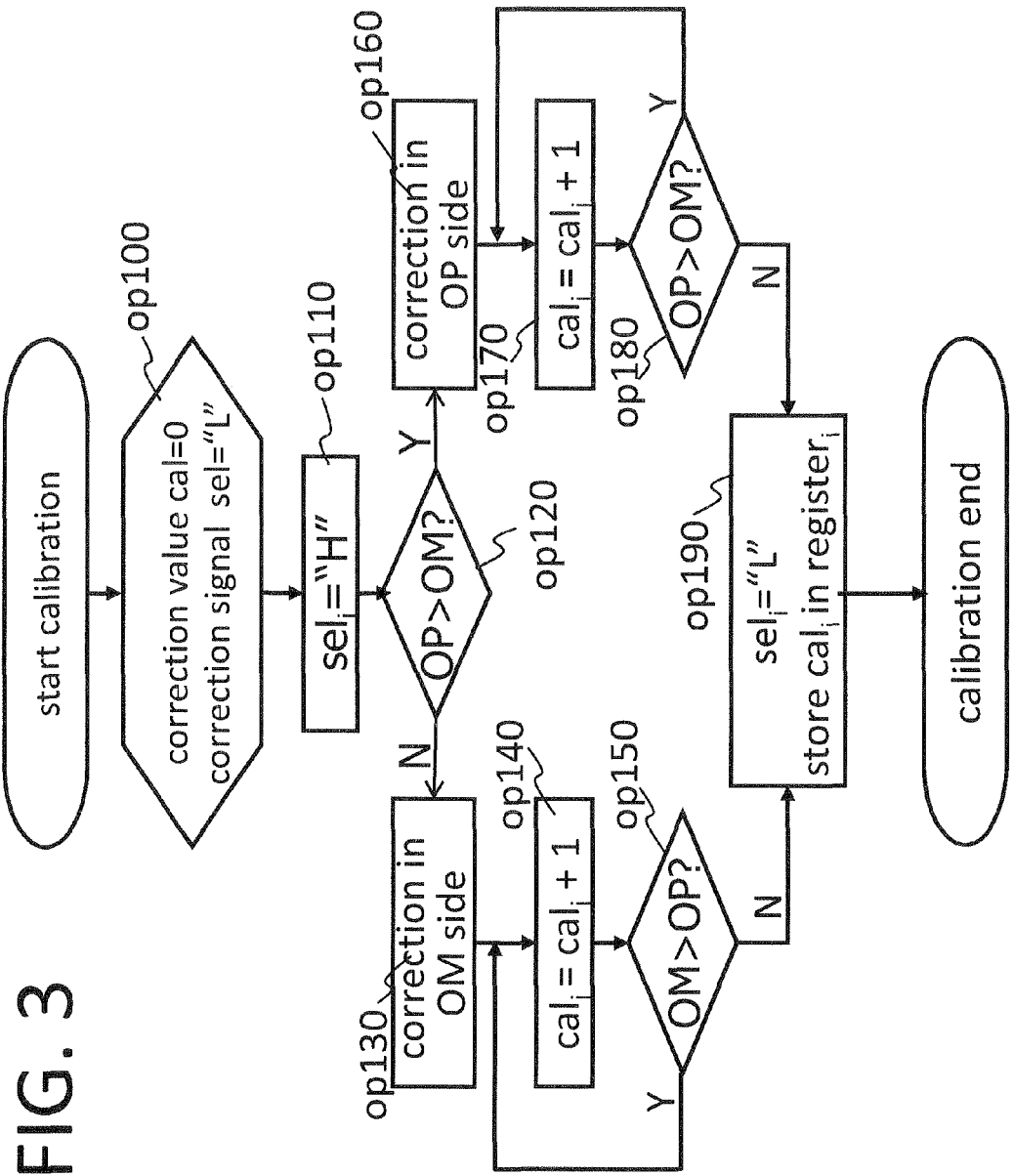
FIG. 3 is a flowchart illustrating a calibration operation of the comparator.

FIG. 3 is a flowchart illustrating the calibration operation of the comparator 10.

In operation op100, the threshold controller 20 is put into a default state. For example, the CPU 26 outputs the correction signal "sel" having logic "L" and also outputs a reset signal "reset" to reset the pulse counter 22. The CPU 26 also sets the correction value, stored in the register 24, such that that the correction value "cal"=0. As a result, the correction value "cal"=0 is output from the register 24, a code signal corresponding to the correction value "cal"=0 is also output from the decoder 23.

In operation op110, the threshold controller 20 starts detection of an offset. The CPU 26 causes the logic of the correction signal "sel" to rise from logic "L" to logic "H". In the threshold controller 20, when the logic "H" signal is output from the OR circuit 25 in response the output signal OM or OP, the clock signal CLK is supplied to the pulse counter 22.

In operation op120, the threshold controller 20 determines whether the offset is present at the output signal OM side or the output signal OP side. The CPU 26 compares the potential of the output signal OM with the potential of the output signal OP and outputs, to the signal supplying circuit 27, a signal "ss" that is dependent on which of the potentials is higher. In accordance with the logic of the signal "ss", the threshold controller 20 determines to which of the offset cancel units 30 and 40 the code signal is to be output. When the potential of the output signal OP is higher than the potential of the output signal OM, the process proceeds to operation op130. When the potential of the output signal OM is higher than the potential of the output signal OP, the process proceeds to operation op160.

In operations op130, op140, and op150, the threshold controller 20 performs an operation for detecting an offset. In this case, since it has been determined in operation op120 that the potential of the output signal OP is higher than the potential of the output signal OM, the amount of current flowing to the nMOS transistor 55 is larger even when the potential of the input signal VIP and the potential of the input signal VIM are equal to each other.

Accordingly, the CPU 26 operates the offset cancel unit 40 to set the logic of the signal "ss" so that the cancel current flows to the signal line through which the output signal OP propagates.

The pulse counter 22 counts the clocks of the clock signal CLK. When the magnitude relationship between the potential of the output signal OP and the potential of the output signal OM is reversed, the pulse counter 22 outputs the count value thereof to the register 24 as the correction value "cal". Thereafter, the process proceeds to operation op190. The offset detection operation of the threshold controller 20 is described below in detail with reference to timing diagrams illustrated in FIG. 4.

In operations op160, op170, and op180, the threshold controller 20 performs an operation for detecting an offset. In this case, since it has been determined in operation op120 that the potential of the output signal OM is higher than the potential of the output signal OP, the amount of current flowing to the nMOS transistor 56 is larger even when the potential of the input signal VIP and the input signal VIM are equal to each other.

Accordingly, the CPU 26 operates the offset cancel unit 30 to set the logic of the signal "ss" so that the cancel current flows to the signal line through which the output signal OM propagates.

The pulse counter 22 counts the clocks of the clock signal CLK. When the magnitude relationship between the potential of the output signal OM and the potential of the output signal OP is reversed, the pulse counter 22 outputs the count value thereof to the register 24 as the correction value "cal". Thereafter, the process proceeds to operation op190. The offset detection operation of the threshold controller 20 is described below in detail with reference to the timing diagrams illustrated in FIG. 4.

In operation op190, the threshold controller 20 completes the offset detection operation. The CPU 26 causes the logic of the correction signal "sel" to fall from logic "H" to logic "L". The correction value "cal" output from the pulse counter 22 is stored in the register 24. Thereafter, the calibration operation of the comparator 10 ends.

When the analog-digital circuit includes a plurality of comparators 10, the CPU 26 sequentially performs the calibration operation on all of the comparators 10 and causes the correction values "cal" for the comparators 10 to be stored in respective registers 24.

Figure 4:
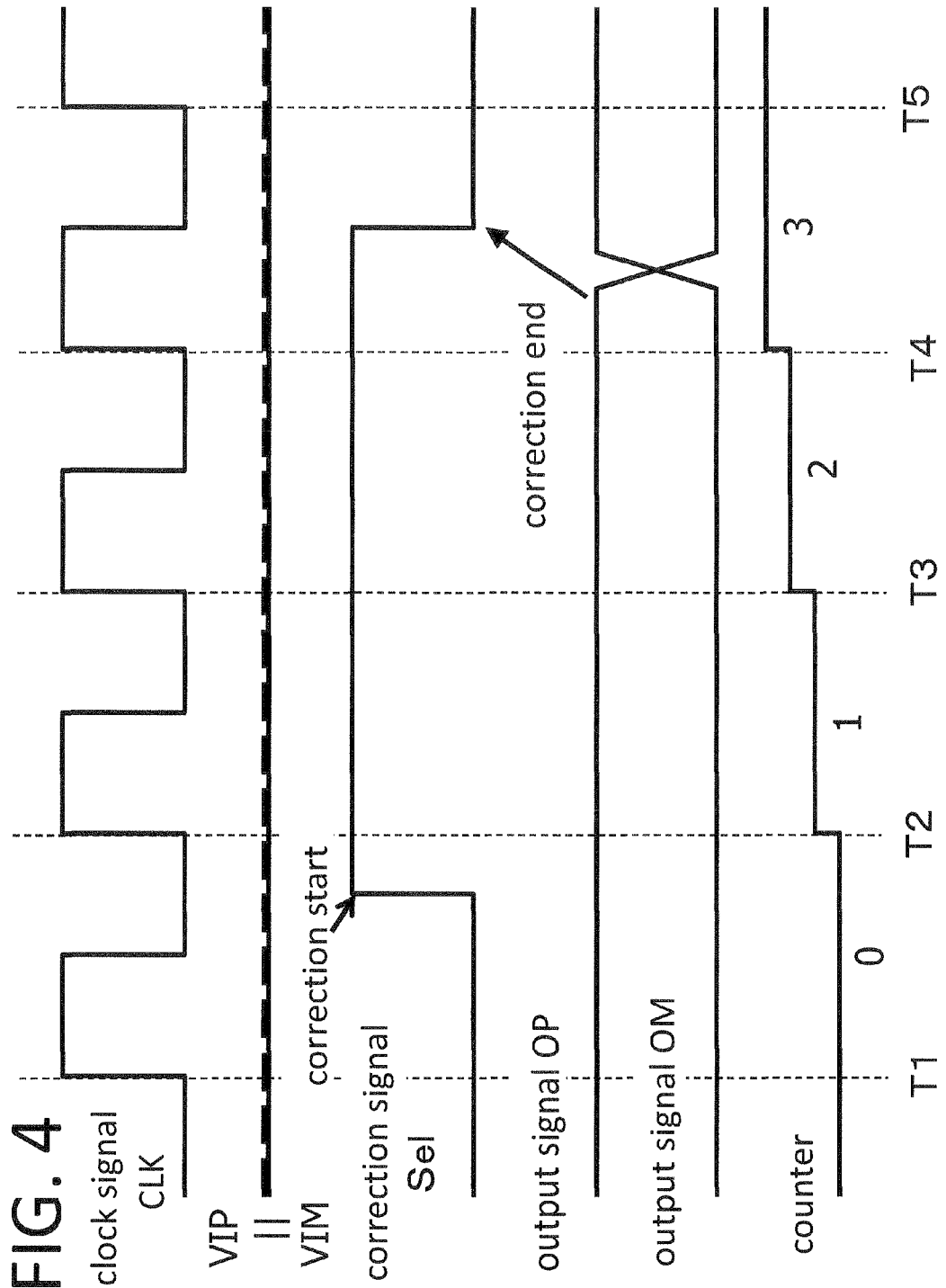
FIG. 4 is a timing diagram illustrating changes in the potentials of signals involved in the operation of the threshold controller in conjunction with time.

The timing diagrams of FIG. 4 illustrate changes in the potentials of the signals involved in the operation of the threshold controller 20 in conjunction with time.

For causing the threshold controller 20 to perform the offset detection operation, the CPU 26 inputs the input signal VIP and the input signal VIM that have the same potential. In this case, it may be regarded that, when a potential difference occurs between the potential of the output signal OP and the potential of the output signal OM, an offset is occurring in the comparator 10.

In order to start the offset detection operation between time T1 and time T2, the CPU 26 causes the correction signal "sel" output therefrom to rise. Consequently, the clock signal CLK is output from the AND circuit 21, so that the pulse counter 22 starts counting at time T2.

At times T2, T3, and T4, the count value is counted up and the code signal corresponding to the count value is output from the decoder 23.

In accordance with the code signal, a predetermined number of switches in the n switches 331, 332, . . . , 33n in the offset cancel unit 30 or a predetermined number of switches in the n switches 431, 432, . . . , 43n in the offset cancel unit 40 connect the nMOS transistors corresponding to the switches and the corresponding signal line through which the output signal OP or OM propagates. Whether the code signal is to be sent to the switches 331, 332, . . . , 33n in the offset cancel unit 30 or is to be sent to the switches 431, 432, . . . , 43n in the offset cancel unit 40 is determined according to the logic of a signal that the CPU 26 outputs to the signal supplying circuit 27 in accordance with the result of the comparison between the potential of the output signal OM and the potential of the output signal OP.

Variations in the potential of the output signal OM which occur each time one of the switches 331, 332, . . . , 33n in the offset cancel unit 30 and the switches 431, 432, . . . , 43n in the offset cancel unit 40 is turned on are described below with reference to FIG. 5.

As a result of the variation, between time T4 and time T5, the number of MOS transistors connected to the signal line through which the output signal OP or OM propagates reaches a certain value and the potentials of the output signal OP and the output signal OM are reversed. At this point, the current flowing in the pMOS transistor 51 in the first current path to which the output signal OM Is connected and the current flowing to the pMOS transistor 52 in the second current path to which the output signal OP is connected are assumed to be substantially equal to each other, and thus, it is regarded that the offset of the comparator 10 is canceled.

Accordingly, when the potential of the output signal OP and the potential of the output signal OM are reversed, the CPU 26 causes the logic of the correction signal "sel" to fall from "H" to thereby end the offset detection operation of the threshold controller 20. As a result, the count-up operation of the pulse counter 22 is also ended. The count value obtained when the count-up operation of the pulse counter 22 is ended is regarded as a detected offset.

Figure 5:
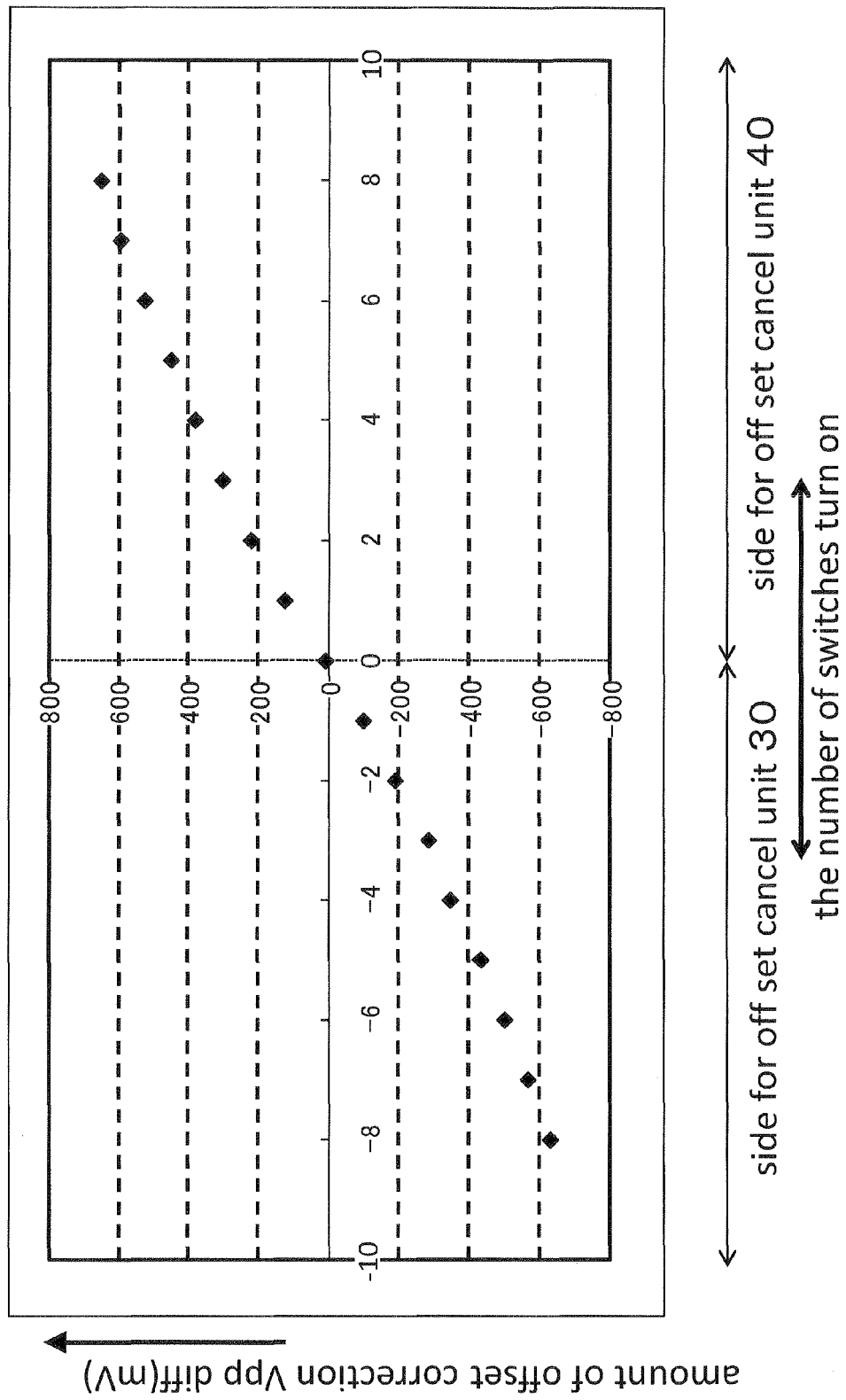

FIG. 5 is a graph illustrating the amount of offset correction for the offset cancel units 30 and 40 during the offset detection operation versus the number of switches turned on.

In the graph of FIG. 5, the positive axis of the horizontal axis indicates the number of switches turned on in the offset cancel unit 40 and the negative axis of the horizontal axis indicates the number of switches turned on in the offset cancel unit 30.

The nMOS transistors connected by the switches have a size of, for example, W=0.5 μm and L=0.06 μm.

The vertical axis of the graph indicates the amount of offset correction Vpp_diff (mV), which represent a change in the potential of the output signal OM with respect to the number of switches connected during the offset detection operation.

That is, each time one of the switches in the offset cancel unit 30 is turned on, the potential of the output signal OM decreases by 100 mV relative to the initial potential of the output signal OM. Similarly, each time one of the switches in the offset cancel unit 40 is turned on, the potential of the output signal OM increases by 100 mV relative to the potential of the output signal OP.

The potential of the output signal OM varies as described above in accordance with the opening/closing of the switches, for the following reasons. First, when one of the switches in the offset cancel unit 30 is turned on, the current flowing in the pMOS transistor 51 increases by a certain amount. Consequently, the amount of voltage drop at the drain side of the nMOS transistor, the drop being caused by an on-resistance of the pMOS transistor 51, increases by a certain amount. Accordingly, simulation was performed to determine an amount of voltage drop, assuming that the nMOS transistors, which are connected to the signal line (through which the output signal OM propagates) each time one of the switches is turned on, have a size of, for example, W=0.5 μm and L=0.06 μm. The result of the simulation showed the potential of the output signal OM drops by about 100 mV, since the signal line through which the output signal OM probates is coupled to the drain side of the nMOS transistors.

In the same manner, when one of the switches in the offset cancel unit 40 is turned on, the current flowing in the pMOS transistor 52 increases by a certain amount. Consequently, the amount of voltage drop at the drain side, the drop being caused by an on-resistance of the pMOS transistor 52, increases by a certain amount. Accordingly, simulation was performed to determine an amount of voltage drop, assuming that the nMOS transistors, which are connected to the signal line (through which the output signal OP propagates) each time one of the switches is turned on, have a size of, for example, W=0.5 μm and L=0.06 μm. The result of the simulation showed the potential of the output signal OP drops by about 100 mV, since the signal line through which the output signal OP probates is coupled to the drain side of the nMOS transistors. Consequently, the potential of the output signal OM relative to the potential of the output signal OP increases.

Figure 6:
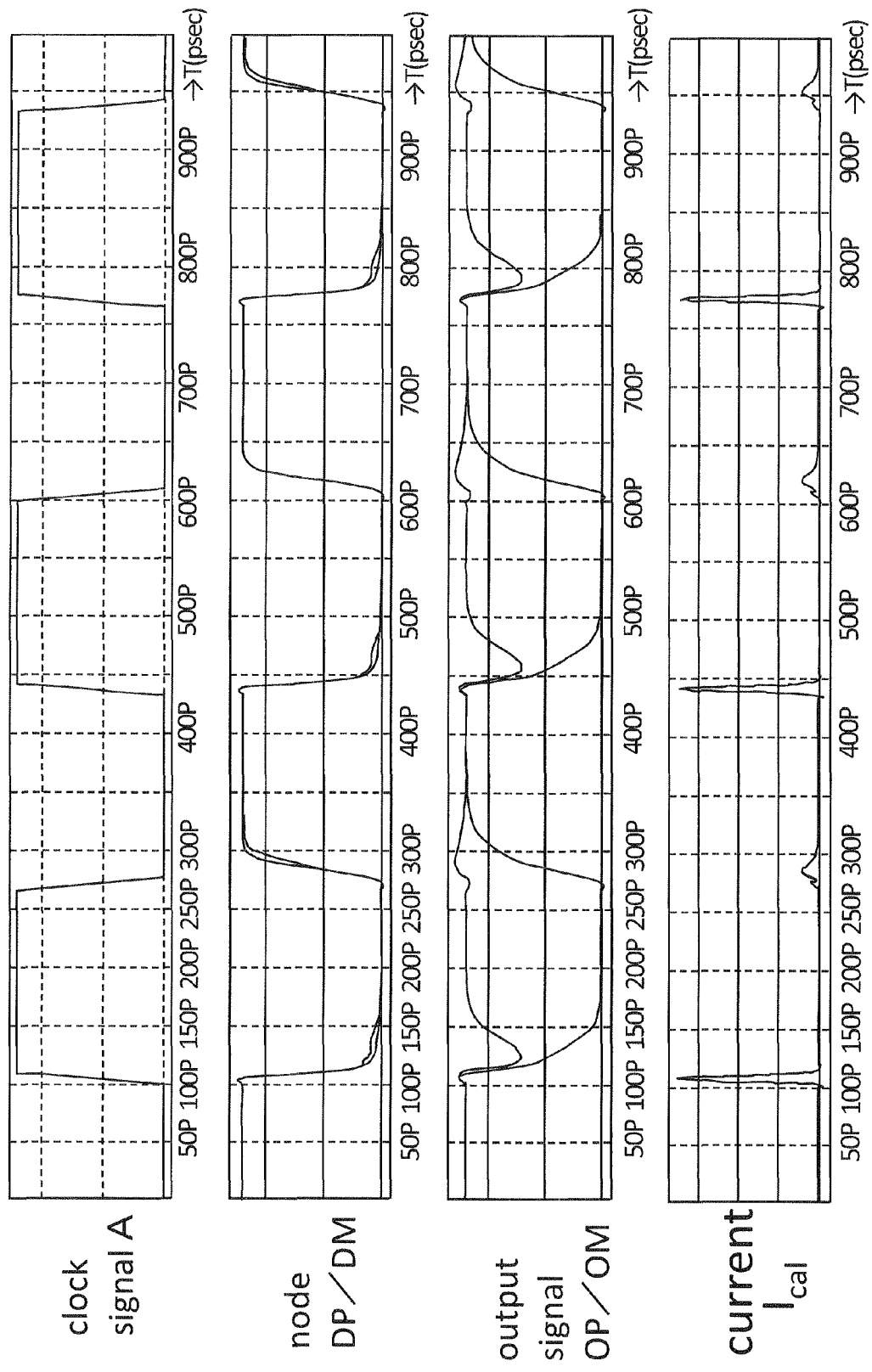
FIG. 6 includes timing diagrams depicting the potentials of the clock signal CLK, the node DP/DM, and the output signal OP/OM during the normal operation of the comparator in conjunction with a temporal change and also a diagram depicting the amount of current flowing in the connected switches in conjunction with a temporal change.

FIG. 6 includes timing diagrams depicting the potentials of the clock signal CLK, the node DP/DM, and the output signal OP/OM during the normal operation of the comparator 10 in conjunction with a temporal change and also a diagram depicting the amount of current flowing in the connected switches in conjunction with a temporal change.

When the offset detection operation is completed, the comparator 10 during the normal operation enters a state in which the switches in the offset cancel unit 30 or the offset cancel unit 40 connect a predetermined number of nMOS transistors to the signal line through which the output signal OM or the output signal OP propagates.

The timing diagrams of FIG. 6 depict a state in which, when the input signal VIP and the input signal VIM that have substantially the same potential and the clock signal CLK are input to the comparator 10, the potentials of the nodes DP and DM and the potentials of the output signals OP and OM change with time. The timing diagram of FIG. 6 also depicts a state in which the amount of current "Ical" flowing in the nMOS transistors coupled to the switches turned on in the offset cancel unit 30 or the offset cancel unit 40 changes with time.

In the timing diagrams for the potential of the clock signal CLK, the potential of the node DP/DM, and the potential of the output signal OP/OM, the vertical axis indicates a potential and the horizontal axis indicates time. In the timing diagram for the change in the amount of current "Ical", the vertical axis indicates a current and the horizontal axis indicates time.

The clock signal CLK has a frequency of 3 GHz and rises from logic "L" to logic "H" at 100 psec, 433 psec, and 766 psec.

In periods in which the clock signal CLK has logic "L", the comparator 10 does not perform the operation for comparing the potential of the input signal VIP and the potential of the input signal VIM. That is, since the switch 57 is disconnected, both of the output signal OM and the output signal OP become logic "H".

On the other hand, in periods in which the clock signal CLK has logic "H", the comparator 10 performs the operation for comparing the potential of the input signal VIP and the potential of the input signal VIM. Thus, when the result of the comparison operation indicates that the potential of the input signal VIP is higher than the input signal VIM, the logic of the output signal OM becomes "L" and the logic of the output signal OP becomes "H".

In the periods in which the clock signal CLK has logic "L", since the switch 57 is disconnected, the logics of both of the nodes DM and DP become "H".

On the other hand, in the periods in which the clock signal CLK has logic "H", the potentials of the nodes DM and DP start falling at the rising of the clock signal CLK and become logic "L" within a period of 30 psec to 40 psec. This is because the switch 57 is turned on, the sources of the nMOS transistors 55 and 56 are connected to ground, the nMOS transistors 55 and 56 are turned on, and thus the nodes DM and OP are also connected to ground.

When any of the switches 331, 332, . . . , 33n is turned on and any of the nMOS transistors 341, 342, . . . , 34n is connected to the signal line of the output signal OM or when any of the switches 431, 432, . . . , 43n is turned on and any of the nMOS transistors 441, 442, . . . , 44n is coupled to the signal line of the output signal OM, the current flows in the connected nMOS transistor(s) when the logic of the clock signal CLK rises. However, when the period of 30 psec to 40 psec passes after the logic of the clock signal CLK rises, the logics of the nodes DM and DP become "L", i.e., the potentials of the nodes DM and DP reach the ground level. Consequently, the nMOS transistors 341, 342, . . . , 34n whose gate electrodes are coupled to the node DM and the nMOS transistors 441, 442, . . . , 44n whose gate terminals are coupled to the node DP are turned off. Consequently, after the period of 30 psec to 40 psec passes, no current flows to the nMOS transistors 341, 342, . . . , 34n and the nMOS transistors 441, 442, . . . , 44n.

As described above, the comparator 10 according to the first embodiment is directed to an amplifying circuit including:

a pair of nMOS transistors (the nMOS transistors 55, 56) having gate electrodes that receive differential input signals;

an amplifier (the transistors 51 to 54) that is electrically coupled to drains of the pair of nMOS transistors and a high-potential power-supply line (AVD) to amplify a difference between potentials of differential output nodes (the output nodes to which the output signals OM and OP are connected) electrically coupled to the corresponding drains of the pair of nMOS transistors and to hold the amplified potential at the differential output nodes;

offset cancel units (the offset cancel units 30 and 40) that cause cancel current to flow to one of the differential output nodes when the amplifier amplifies a voltage between the differential output nodes and that shut off, after the amplifier performs the amplification operation, inflow of the cancel current to the differential output node in accordance with voltage of the drains of the pair of nMOS transistors; and a threshold controller (the threshold controller 20) that performs setting so that potentials of first and second ones of the differential input signals are equal to each other, that compares, before the inflow of the cancel current, potentials generated at the differential output nodes when the difference between the potentials of the differential output nodes is amplified, and that sets the cancel current so that the potentials are reversed after the inflow of the cancel current.

The comparator 10 according to the first embodiment is directed to an amplifying circuit in which the offset cancel units (the offset cancel unit 30 and 40) include:

n switches (switches 331, 332, . . . , 33n and n switches 431, 432, 43n) having first terminals coupled to one of the differential output nodes (the output nodes to which the output signals OM and OP are connected); and n MOS transistors (nMOS transistors 341, 342, . . . , 34n and the nMOS transistors 441, 442, . . . , 44) that have drain terminals coupled to second terminals of the n switches, gate terminals coupled to one of the drains of the pair of MOS transistors, and source terminals that are settable at a ground potential.

The comparator 10 according to the first embodiment is directed to an amplifying circuit in which the threshold controller includes:

a pulse counter (the pulse counter 22) that counts clock pulses in response to a clock signal CLK;

a register (the register 24) that stores a count value output from the pulse counter; and a decoder circuit (the decoder 23) that outputs, during calibration operation, a code signal corresponding to the count value output from the pulse counter and that outputs, during the amplification operation, a code signal corresponding to the counter value output from the register.

An amplifying method for the comparator 10 according to the first embodiment is directed to an amplifying circuit including:

a pair of nMOS transistors having gate electrodes that receive differential input signals;

an amplifier that is connected electrically coupled to drains of a pair of nMOS transistors and a high-potential power supply line;

offset cancel circuits that are electrically coupled to the differential output nodes of the amplifier, the drains of the pair of nMOS transistors, a ground power supply and that cause cancel current to flow to the differential output nodes; and a threshold controller that sets the cancel current, the method including:

a step of performing setting so that potentials of first and second ones of the differential input signals are equal to each other, comparing, before the inflow of the cancel current, potentials generated at the differential output nodes when the difference between the potentials of the differential output nodes is amplified, and that setting the cancel current so that the potentials are reversed after the inflow of the cancel current;

a step of causing the cancel current to flow to one of the differential output nodes when the amplifier amplifies a voltage between the differential output nodes and shutting off, after the amplifier performs the amplification operation, inflow of the cancel current to the differential output node in accordance with voltages of the drains of the pair of the nMOS transistors; and a step of amplifying a difference between the potentials of the differential output nodes electrically coupled to the drains of the pair of nMOS transistors and holding the amplified potential at the differential output nodes.

In the comparator 10 of the first embodiment, during the comparison operation, the offset cancel circuits 30 and 40 cause the current to flow to the corresponding differential output nodes so as to cancel an offset. However, after the comparison operation is completed, when the potentials of the differential output nodes are stabilized to indicate a certain logic, the logics of the potentials of the drains of the pair of nMOS transistors whose gates receive the input signals become "L". Thus, the offset cancel circuits 30 and 40 terminate supply of the current to the differential output nodes. This results in a reduction in the amount of power consumed by the offset cancel operation of the comparator 10.

Second Embodiment

Figure 7:
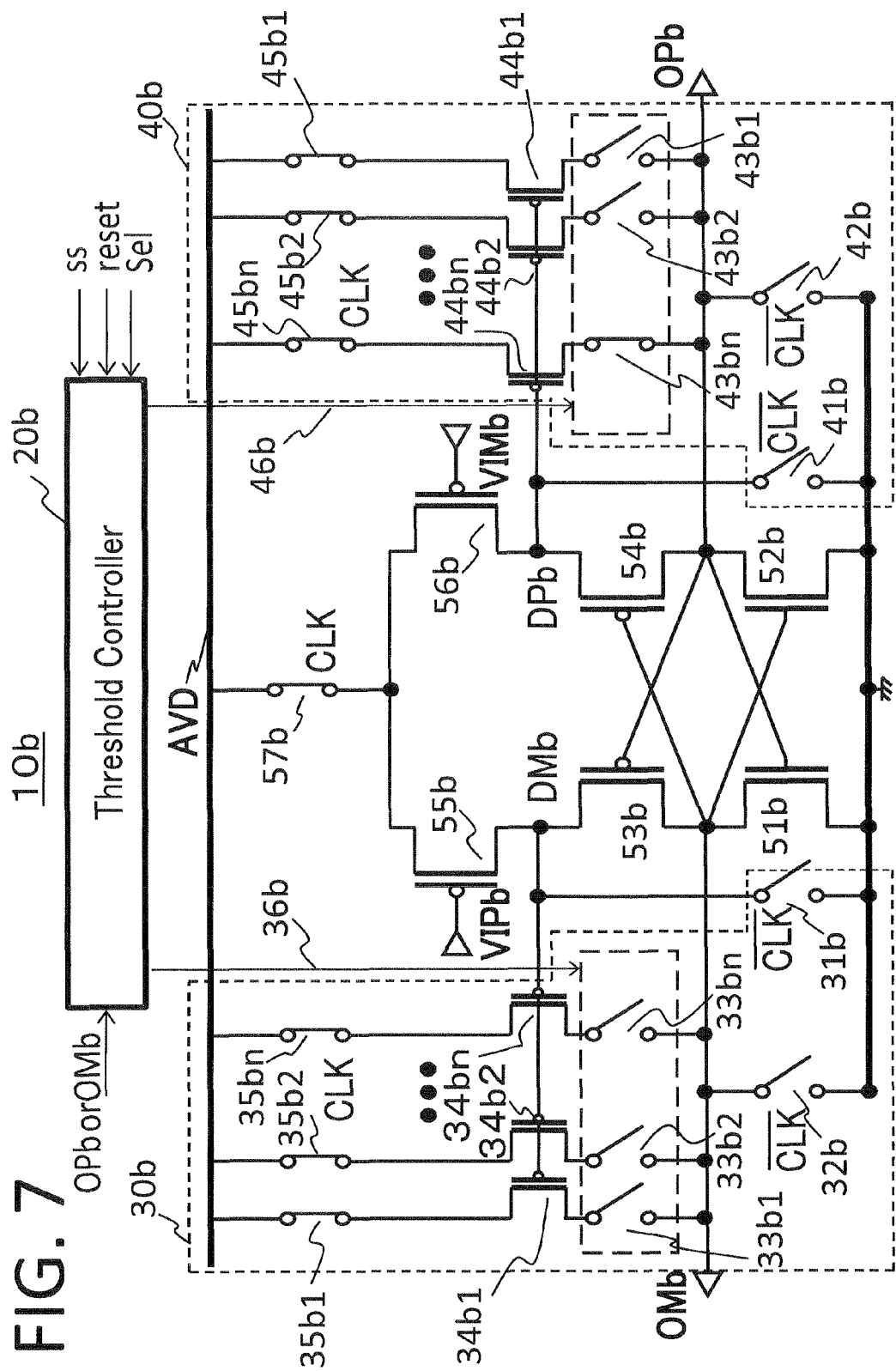
FIG. 7 is a circuit diagram illustrating a comparator of a second embodiment.

FIG. 7 is a circuit diagram illustrating a comparator 10b according to a second embodiment. The comparator 10b includes a threshold controller 20b, an offset cancel unit 30b, an offset cancel unit 40b, nMOS transistors 51b and 52b, pMOS transistors 53b, 54b, 55b, and 56b, and a switch 57b.

The comparator 10b has a function for performing an operation for comparing an input signal VIPb and an input signal VIMb, i.e., a function for performing an operation for amplifying a difference between potentials of an input signal VIPb and an input signal VIMb. The comparator 10b is also capable of performing an operation for calibrating its own offset. In this respect, the comparator 10b is similar to the comparator 10 of the first embodiment.

The nMOS transistor 51b has a source coupled to a ground line, a drain coupled to a drain of the pMOS transistor 53b, and a gate coupled to a drain of the pMOS transistor 54b. The drain of the nMOS transistor 51b is also coupled to an output terminal via which an output signal OMb is output.

The pMOS transistor 53b has a source coupled to a node DMb and a gate coupled to the drain of the pMOS transistor 54b.

The pMOS transistor 55b has a source coupled to a first electrode of the switch 57b and a gate coupled to a signal line through which an input signal VIPb propagates.

The nMOS transistor 51b, the pMOS transistor 53b, and the pMOS transistor 55b are coupled in series between the switch 57b and the ground line via the sources and the drains, to thereby form a first current path including the node DMb. In accordance with the potential of the input signal VIPb, the pMOS transistor 55b controls a current in the first current path to increase/reduce the current.

The nMOS transistor 52b has a source coupled to the ground line, a drain coupled to the drain of the pMOS transistor 54b, and a gate coupled to the drain of the pMOS transistor 53b. The drain of the nMOS transistor 52b is also coupled to an output terminal via which an output signal OPb is output.

The pMOS transistor 54b has a source coupled to a node DPb and a gate coupled to the drain of the pMOS transistor 53b.

The pMOS transistor 56b has a source coupled to the first electrode of the switch 57b and a gate coupled to a signal line through which an input signal VIMb propagates.

The nMOS transistor 52b, the pMOS transistor 54b, and the pMOS transistor 56b are coupled in series between the switch 57b and the ground line via the sources and the drains, to thereby form a second current path including the node DPb. In accordance with the potential of the input signal VIMb, the pMOS transistor 56b controls a current in the second current path to increase/reduce the current.

In accordance with the potential of a clock signal CLK, the switch 57b connects or disconnects the sources of the pMOS transistors 55b and 56b and a high-potential line AVD.

The transistors belonging to the first current path, the transistors belonging to the second current path, and the switch 57b amplify a difference between the potentials of nodes to which the output terminals of the output signals OMb and OPb are connected, set the potential of the node having a higher one of the potentials to logic "H", and set the potential of the node having a lower one of the potentials to logic "L". Thus, the transistors belonging to the first current path, the transistors belonging to the second current path, and the switch 57b form a signal amplifier.

The offset cancel unit 30b serves as a circuit that controls, in accordance with the potential of the node DMb and a code signal 36b including a digital signal from the threshold controller 20b, cancel current flowing from the first current path to the high-potential line AVD via the output terminal of the output signal OMb.

The offset cancel unit 30b includes n switches 33b1, 33b2, ..., 33bn, n pMOS transistors 34b1, 34b2, ..., 34bn, n switches 35b1, 35b2, 35bn, and switches 31b and 32b.

The n switches 33b1, 33b2, ..., 33bn have first ends coupled to the output terminal of the output signal OMb and second ends coupled to corresponding drains of the pMOS transistors 34b1, 34b2, ..., 34bn. The pMOS transistors 34b1, 34b2, ..., 34bn have sources coupled to corresponding first ends of the switches 35b1, 35b2, ..., 35bn and gates coupled to the node DMb. Second ends of the switches 35b1, 35b2, ..., 35bn are coupled to the high-potential line AVD. The switch 32b connects or disconnects the output terminal of the output signal OMb and the ground line. The switch 31b connects or disconnects the node DMb and the ground line. The switches 31b and 32b execute the connections or disconnections in accordance with the potential of an inverted signal /CLK of the clock signal CLK. Thus, before the amplification operation is started, the output terminal of the output signal OMb and the node DMb have potentials that are equal to the potential of the ground line. When the amplification operation is started, the output terminal of the output signal OMb and the node DMb are disconnected from the ground line.

The switches 35b1, 35b2, ..., 35bn execute connection or disconnection in accordance with the potential of the clock signal CLK. The clock signal CLK and the inverted signal /CLK thereof have logic states that are opposite to each other.

When the n switches 33b1, 33b2, ..., 33bn receive the code signal 36b output from the threshold controller 20b and constituted by a multi-bit digital signal, a number of n switches 33b1, 33b2, ..., 33bn which corresponds to a binary number expressed by the digital signal enter connected states and the other switches maintain disconnected states.

Thus, during the amplification of the voltage between the output terminal of the output signal OMb, the output terminal being coupled to the node DMb via the nMOS transistor 53b, and the output terminal of the output signal OPb, the output terminal being coupled to the node DPb via the nMOS transistor 54b, the offset cancel unit 30b causes the cancel current to flow to the output terminal of the output signal OMb via the pMOS transistors 34b1, 34b2, ..., 34bn and the switches 33b1, 33b2, ..., 33bn that are in the connected states. The cancel current is current for canceling the offset of the comparator 10b. After the voltage is amplified, since the potential of the node DMb becomes substantially equal to the potential level of the high-potential line AVD, the pMOS transistors 34b1, 34b2, ..., 34bn are turned off to shut off the inflow of the cancel current.

The offset cancel unit 40b serves as a circuit that controls, in accordance with the potential of the node DPb and a code signal 46b including a digital signal from the threshold controller 20b, cancel current flowing from the second current path to the high-potential line AVD via the output terminal of the output signal OPb.

The offset cancel unit 40b includes n switches 43b1, 43b2, ..., 43bn, n pMOS transistors 44b1, 44b2, ..., 44bn, n switches 45b1, 45b2, ..., 45bn, and switches 41b and 42b.

The n switches 43b1, 43b2, ..., 43bn have first ends coupled to the output terminal of the output signal OPb and second ends coupled to corresponding drains of the pMOS transistors 44b1, 44b2, ..., 44bn. The pMOS transistors 44b1, 44b2, ..., 44bn have sources coupled to corresponding first ends of the switches 45b1, 45b2, ..., 45bn and gates coupled to the node DPb. Second ends of the switches 45b1, 45b2, ..., 45bn are coupled to the high-potential line AVD. The switch 42b connects or disconnects the output terminal of the output signal OPb and the ground line. The switch 41b connects or disconnects the node DPb and the ground line.

The switches 41b and 42b execute the connections or disconnections in accordance with the potential of the inverted signal /CLK of the clock signal CLK. Thus, before the amplification operation is started, the output terminal of the output signal OPb and the node DPb have potentials that are equal to the potential of the ground line. When the amplification operation is started, the output terminal of the output signal OPb and the node DPb are disconnected from the ground line.

The switches 45b1, 45b2, ..., 45bn execute connection or disconnection in accordance with the potential of the clock signal CLK. The clock signal CLK and the inverted signal /CLK thereof have logic states that are opposite to each other.

When the n switches 43b1, 43b2, ..., 43bn receive the code signal output from the threshold controller 20b and constituted by a multi-bit digital signal, a number of n switches 43b1, 43b2, ..., 43bn which corresponds to a binary number expressed by the digital signal enter connected states and the other switches maintain disconnected states. Thus, similarly to the offset cancel unit 30b, the offset cancel unit 40b also causes the cancel current to flow to the output terminal of the output signal OPb when the amplification operation is started and shuts off the inflow of the cancel current after the amplification operation is completed.

As described above, the signal amplifier, constituted by the transistors belonging to the first current path, the transistors belonging to the second current path, and the switch 57b, in the comparator 10b of the second embodiment is different from the amplifier in the comparator 10 of the first embodiment in that the high-potential power-supply line AVD and the ground line are interchanged, the nMOS transistors are replaced with the pMOS transistors, and the pMOS transistors are replaced with the nMOS transistors. The same is also true when the offset cancel units 30b and 40b in the second embodiment are compared with the offset cancel units 30 and 40 in the first embodiment.

However, the amplifier in the second embodiment and the amplifier in the first embodiment have similar functions. Similarly, the offset cancel units 30b and 40b in the second embodiment and the offset cancel units 30 and 40 in the first embodiment also have similar functions.

Accordingly, the comparator 10b of the second embodiment is directed to an amplifying circuit including:

a pair of pMOS transistors (the pMOS transistors 55b, 56b) having gate electrodes that receive differential input signals;

an amplifier (the transistors 51b to 54b) that is electrically coupled to drains of the pair of pMOS transistors and a ground line to amplify a difference between potentials of differential output nodes (the output nodes to which the output signals OMb and OPb are connected) electrically coupled to the corresponding drains of the pair of pMOS transistors and to hold the amplified potential at the differential output nodes;

offset cancel circuits (the offset cancel units 30b and 40b) that cause cancel current to flow to one of the differential output nodes when the amplifier amplifies a voltage between the differential output nodes and that shut off, after the amplifier performs the amplification operation, inflow of the cancel current to the differential output node in accordance with voltages of the drains of the pair of pMOS transistors; and a threshold controller (the threshold controller 20b) that performs setting so that potentials of first and second ones of the differential input signals are equal to each other, that compares, before the inflow of the cancel current, potentials generated at the differential output nodes when the difference between the potentials of the differential output nodes is amplified, and that sets the cancel current so that the potentials are reversed after the inflow of the cancel current.

In the comparator 10b of the second embodiment, during the amplification operation, the offset cancel units 30b and 40b cause the current to flow to the corresponding differential output nodes so as to cancel an offset. After the amplification, however, when the potentials of the differential output nodes are stabilized to indicate a certain logic, the logics of the potentials of the drains of the pair of pMOS transistors become "H" and thus the offset cancel units block current flowing to the differential output node.

Thus, the comparator 10b may reduce power consumed during the offset cancel operation.

Third Embodiment

Figure 8:
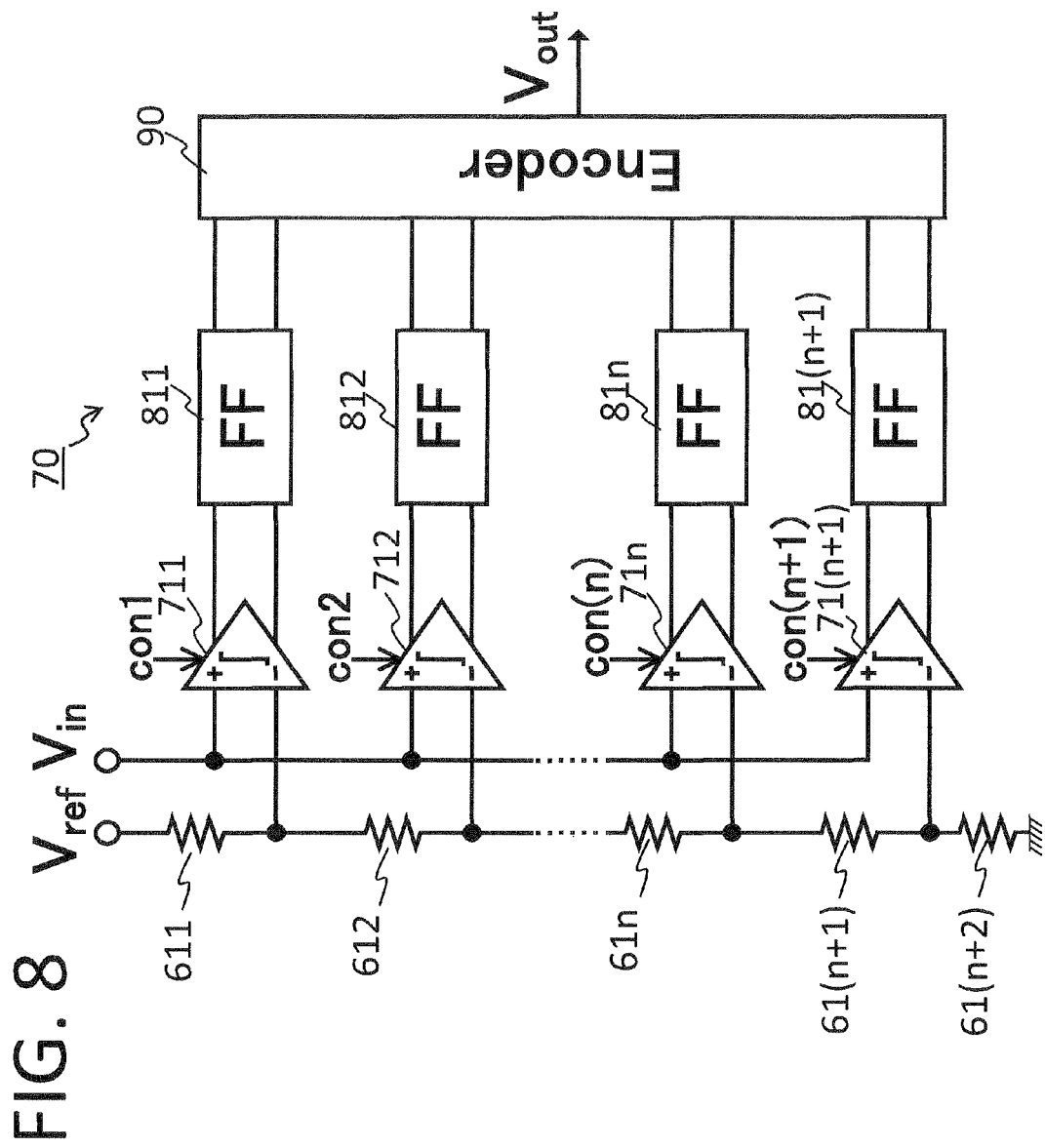
FIG. 8 illustrates an analog-digital circuit 70 that employs the comparator of the first embodiment or the comparator of the second embodiment.

FIG. 8 illustrates an analog-digital circuit 70 that employs the comparator 10 of the first embodiment or the comparator 10b of the second embodiment. The analog-digital circuit 70 includes n+2 resistors 611 to 61(n+2), n+1 comparators 711 to 71(n+1), n+1 flip-flops (FF) 811 to 81(n+1), and an encoder 90.

The resistors 611 to 61(n+2) constitute a series of resistors coupled in series between a reference power supply and a ground power supply. The reference power supply supplies a voltage Vref to the analog-digital circuit 70. Resistance values of the resistors 611 to 61(n+2) are equal to each other.

Each of the comparators 711 to 71(n+1) has a function that is similar to the function of the comparator 10 of the first embodiment or the comparator 10b of the second embodiment. Thus, a detailed description of the function of the comparators 711 to 71(n+1) is omitted. The comparators 711 to 71(n+1) receive, as one of the complementary signals described above in the first embodiment, an analog signal Vin input to the analog-digital circuit 70. The comparators 711 to 71(n+1) receive, as the other of the complementary signals described in the first embodiment, corresponding signals output from connection points via which the resistors 611 to 61(n+2) are coupled in series.

Thus, the analog-digital circuit 70 according to the third embodiment determines to which of the voltage sections determined according to the resistance values of the resistors 611 to 61(n+2) the voltage of the analog signal Vin belongs, to thereby digitize the analog signal Vin.

The comparators 711 to 71(n+1) receive a signal "con", including the correction signal "sel", the reset signal "reset", and the signal "ss", from the CPU 26. Upon the reception, the normal amplification operation and the calibration operation are switched and the threshold controller 20b is reset. Needless to say, during the calibration operation, signals having the same potential are input to two terminals of each of the comparators 711 to 71(n+1). That is, the CPU 26 performs control so that the potential of the analog signal Vin is equal to the potential of the connection point that is included in the connection points via which the resistors are coupled in series and that is coupled to the comparator to be calibrated.

With this arrangement, immediately after the power supply is turned on, the analog-digital circuit 70 of the third embodiment may perform the calibration operation on the comparators 711 to 71(n+1) under the control of the CPU 26. As a result, the correction values "cal" for the comparators 711 to 71(n+1) are stored in the registers 24.

Accordingly, when the comparators 711 to 71(n+1) are set under the control of the CPU 26 so as to perform the normal amplification operation, the offset cancel unit 30 or 40 causes the cancel currents to flow to the output terminals of output signals OP or OM during the amplification operation. As a result, the offsets of the comparators 711 to 71(n+1) are corrected.

According to the analog-digital circuit 70 in the second embodiment, since the offsets of the comparators are substantially eliminated, to which of the voltage sections determined according to the resistance values of the resistors 611 to 61(n+2) the voltage of the analog signal Vin belongs is correctly determined.

The flip-flops 811 to 81(n+1) receive the complementary signals output from the comparators 711 to 71(n+1), latch the complementary signals, and output the latched complementary signals to the encoder 90. The encoder 90 receives logic values represented by the complementary signals.

After receiving the logic signals output from the flip-flops 811 to 81(n+1), the encoder 90 outputs a multi-bit digital signal Vout corresponding to the potential of the analog signal.

As described above, the analog-digital circuit according to the third embodiment is directed to an analog-digital circuit including:

a series of resistors coupled in series between a reference power supply and a ground power supply;

comparators, each being coupled to one of connection points via which the resistors are coupled in series to compare a potential of an input signal with a potential of the connection point to which the corresponding comparator is coupled; and an encoder that outputs a digital signal corresponding to the potential of the input signal, in accordance with comparison results output from the comparators;

wherein each comparator includes:

a pair of nMOS transistors having gate electrodes that receive potential of the input signal and the potential of the connection point;

an amplifier that is electrically coupled to drains of the pair of nMOS transistors and a high-potential power-supply line to amplify a difference between potentials of differential output nodes electrically coupled to the corresponding drains of the pair of nMOS transistors and to hold the amplified potential at the differential output nodes;

offset cancel circuits that cause the cancel current to flow to one of the differential output nodes when the amplifier amplifies a voltage between the differential output nodes and shut off, after the amplifier performs the amplification operation, inflow of the cancel current to the differential output node in accordance with voltages of the drains of the pair of the MOS transistors; and a threshold controller that performs setting so that the potentials of the input signal and the connection point are equal to each other, that compares, before the inflow of the cancel current, potentials generated at the differential output nodes when the difference between the potentials of the differential output nodes is amplified, and that sets the cancel current so that the potentials are reversed after the inflow of the cancel current.

In the analog-digital circuit described above, when the comparator performs the amplification operation, the offset cancel circuits included in the comparator cause the current to flow to the corresponding differential output nodes in order to cancel an offset. After the amplification, however, when the potentials of the differential output nodes are stabilized, the logics of the potentials of the drains of the pair of nMOS transistors become "L" and thus the offset cancel circuits block current flowing to the differential output nodes.

As a result, the power consumed during the offset cancel operation of the comparator 10 is reduced and the power consumed by the analog-digital circuit including the comparator is also reduced.

Fourth Embodiment

Figure 9:
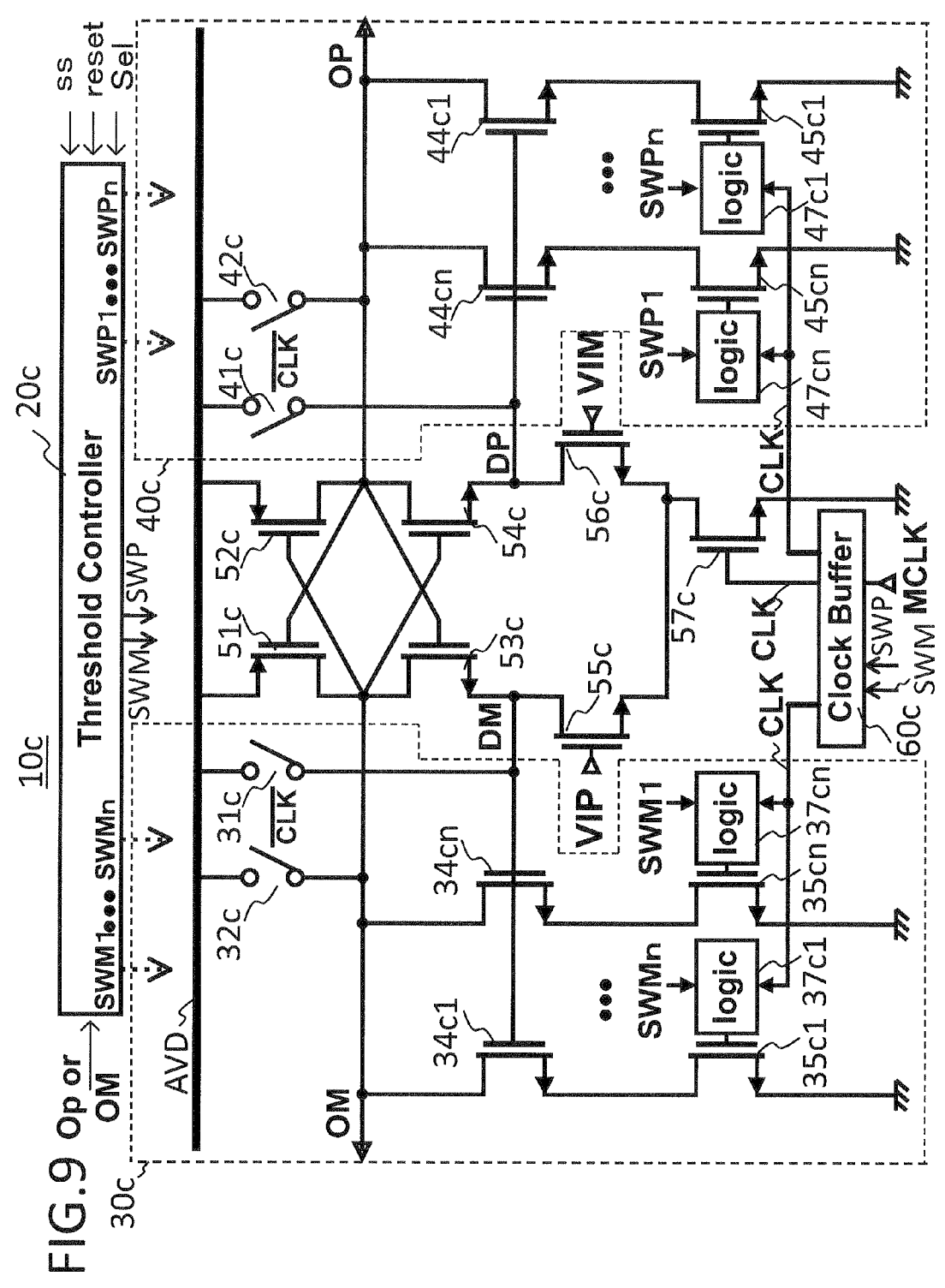

FIG. 9 is a circuit diagram illustrating a comparator 10c according to a fourth embodiment. The comparator 10c includes a threshold controller 20c, an offset cancel unit 30c, an offset cancel unit 40c, pMOS transistors 51c and 52c, nMOS transistors 53c, 54c, 55c, and 56c, a switch 57c, and a clock buffer 60c.

The comparator 10c has a function for performing an operation for comparing an input signal VIP and an input signal VIM, i.e., a function for performing an operation for amplifying a difference between potentials of an input signal VIP and an input signal VIM. The comparator 10c is also capable of performing an operation for calibrating its own offset.

The pMOS transistors 51c and 52c and the nMOS transistors 53c, 54c, 55c, and 56c are similar to the pMOS transistors 51 and 52 and the nMOS transistors 53, 54, 55, and 56 which are included in the comparator 10 of the first embodiment. There is no substantial differences in the connection relationships between the transistors, the connection relationships between a high-potential line AVD and a ground line, the operations, and the functions.

The switch 57c is an nMOS transistor, which has a drain coupled to sources of the nMOS transistors 55c and 56c, a source coupled to the ground line, and a gate that receives a clock signal CLK output from the clock buffer 60c. In accordance with the potential of the clock signal CLK, the switch 57c connects or disconnects the sources of the nMOS transistors 55c and 56c and the ground line.

The clock buffer 60c is a circuit for buffering a master clock signal MCLK and generating the clock signal CLK. The clock buffer 60c is described below with reference to FIG. 18.

The offset cancel unit 30c serves as a circuit that controls, in accordance with the potential of a node DM and digital signals SWM1 to SWMn from the threshold controller 20c, cancel current flowing from the first current path to the ground line via an output line through which an output signal OM is output.

The offset cancel unit 30c includes n nMOS transistors 34c1 to 34cn having gates to which the node DM is coupled, n switches 35c1 to 35cn, logic circuits 37c1 to 37cn, and switches 31c and 32c. The nMOS transistors 34c1 to 34cn have drains coupled to the output line of the output signal OM. The n switches 35c1 to 35cn are nMOS transistors, which have sources to which the ground line is coupled, drains to which sources of the nMOS transistors 34c1 to 34cn are coupled, and gates to which signals output from the logic circuits 37c1 to 37cn are connected. In accordance with the corresponding digital signals SWM1 to SWMn and the potential of the clock signal CLK, the logic circuits 37c1 to 37cn output signals. In accordance with the potentials of the corresponding output signals, the switches 35c1 to 35cn enter on or off states. When the logics of the digital signals SWM1 to SWMn connected to the logic circuits 37c1 to 37cn are "L", the logic circuits 37c1 to 37cn output logic "L" signals, and when the logics of the digital signals SWM1 to SWMn are "H", the logic circuits 37c1 to 37cn output signals having the same logic as the clock signal CLK. Detailed configurations of the logic circuits 37c1 to 37cn are described below with reference to FIGS. 15 and 16.

The switch 32c connects or disconnects the output line of the output signal OM and a high-potential line AVD. The switch 31c connects or disconnects the node DM and the high-potential line AVD. The switches 31c and 32c execute the connections or disconnections in accordance with the potential of an inverted logic signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20c controls the number of, of the n switches 35c1 to 35cn, the switches to be turned on or off.

As a result, the cancel current corresponding to the offset of the comparator 10c flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "L" and thus all of the n nMOS transistors 34c1 to 34cn are turned off. Consequently, the offset cancel unit 30c terminates the generation of the cancel current flowing between the output line of the output signal OM and the ground line.

The offset cancel unit 40c serves as a circuit that controls, in accordance with the potential of a node DP and digital signals SWP1 to SWPn from the threshold controller 20c, cancel current flowing from the second current path to the ground line via an output line through which an output signal OP is output.

The offset cancel unit 40c includes n nMOS transistors 44c1 to 44cn having gates to which the node DP is coupled, n switches 45c1 to 45cn, logic circuits 47c1 to 47cn, and switches 41c and 42c. The nMOS transistors 44c1 to 44cn have drains coupled to the output line of the output signal OP. The n switches 45c1 to 45cn are nMOS transistors, which have sources to which the ground line is coupled, drains to which sources of the nMOS transistors 44c1 to 44cn are coupled, and gates to which signals output from the logic circuits 47c1 to 47cn are connected. In accordance with the corresponding digital signals SWP1 to SWPn and the potential of the clock signal CLK, the logic circuits 47c1 to 47cn output signals. In accordance with the potentials of the corresponding output signals, the switches 45c1 to 45cn enter on or off states. When the logics of the digital signals SWP1 to SWPn connected to the logic circuits 47c1 to 47cn are "L", the logic circuits 47c1 to 47cn output logic "L" signals, and when the logics of the digital signals SWP1 to SWPn are "H", the logic circuits 47c1 to 47cn output signals having the same logic as the clock signal CLK. Detailed configurations of the logic circuits 47c1 to 47cn are described below with reference to FIGS. 15 and 16.

The switch 42c connects or disconnects the output line of the output signal OP and the high-potential line AVD. The switch 41c connects or disconnects the node DP and the high-potential line AVD. The switches 41c and 42c execute the connections or disconnections in accordance with the potential of the inverted logic signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20c controls the number of the n switches 45c1 to 45cn, the switches to be turned on or off.

As a result, the cancel current corresponding to the offset of the comparator 10c flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "L" and thus all of the n nMOS transistors 44c1 to 44cn are turned off. This results in shut off of the cancel current that is generated by the offset cancel unit 40c and that flows between the output line of the output signal OP and the ground line.

Compared with the threshold controller 20 described in the first embodiment, the threshold controller 20c has a circuit configuration and a function which are similar to those of the threshold controller 20, except that the threshold controller 20c outputs the digital signals SWM1 to SWMn and the digital signals SWP1 to SWPn instead of the code signals 36 and 46 for controlling the on/off states of the switches 331 to 33n and the switches 431 to 43n.

In the comparator 10 described in the first embodiment, the switches 331 to 33n and the switches 431 to 43n increase/reduce the amount of the cancel current. Since the switches 351 to 35n and 451 to 45n are turned on/off in response to the clock signal CLK, the period in which the offset cancel units 30 and 40 generate the cancel current is limited to the period in which the logic of the clock signal CLK is "H". In addition, since the nMOS transistors 341 to 34n receive the potential of the node DM and the nMOS transistors 441 to 44n receive the potential of the node DP during operation, the period in which the cancel current flows in the switches 331 to 33n and the switches 431 to 43n is limited.

As opposed to the first embodiment, in the comparator 10c of the fourth embodiment, the switches 35c1 to 35cn and the switches 45c1 to 45cn are nMOS transistors, and the gates thereof receive corresponding signals output from the logic circuits 37c1 to 37cn and the logic circuits 47c1 to 47cn. As a result, the switches 35c1 to 35cn and the switches 45c1 to 45cn increase/reduce the amount of the cancel current and also limit the period in which the offset cancel units 30c and 40c generate the cancel current to the period in which the logic of the clock signal CLK is "H".

On the other hand, since that the gates of the nMOS transistors 34c1 to 34cn receive the potential of the node DM and the gates of the nMOS transistors 44c1 to 44cn receive the potential of the node DP during operation, the period in which the cancel current flows in the switches 34c1 to 34cn and the switches 44c1 to 44cn is limited.

In the comparator 10c of the fourth embodiment, during the comparison operation, the offset cancel units 30c and 40c cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of nMOS transistors whose gates receive the input signals become "L". Thus, the offset cancel units 30c and 40c shut off supply of the current to the differential output nodes DM and DP. This results in a reduction in the amount of power consumed by the offset cancel operation of the comparator 10c.

Fifth Embodiment

Figure 10:
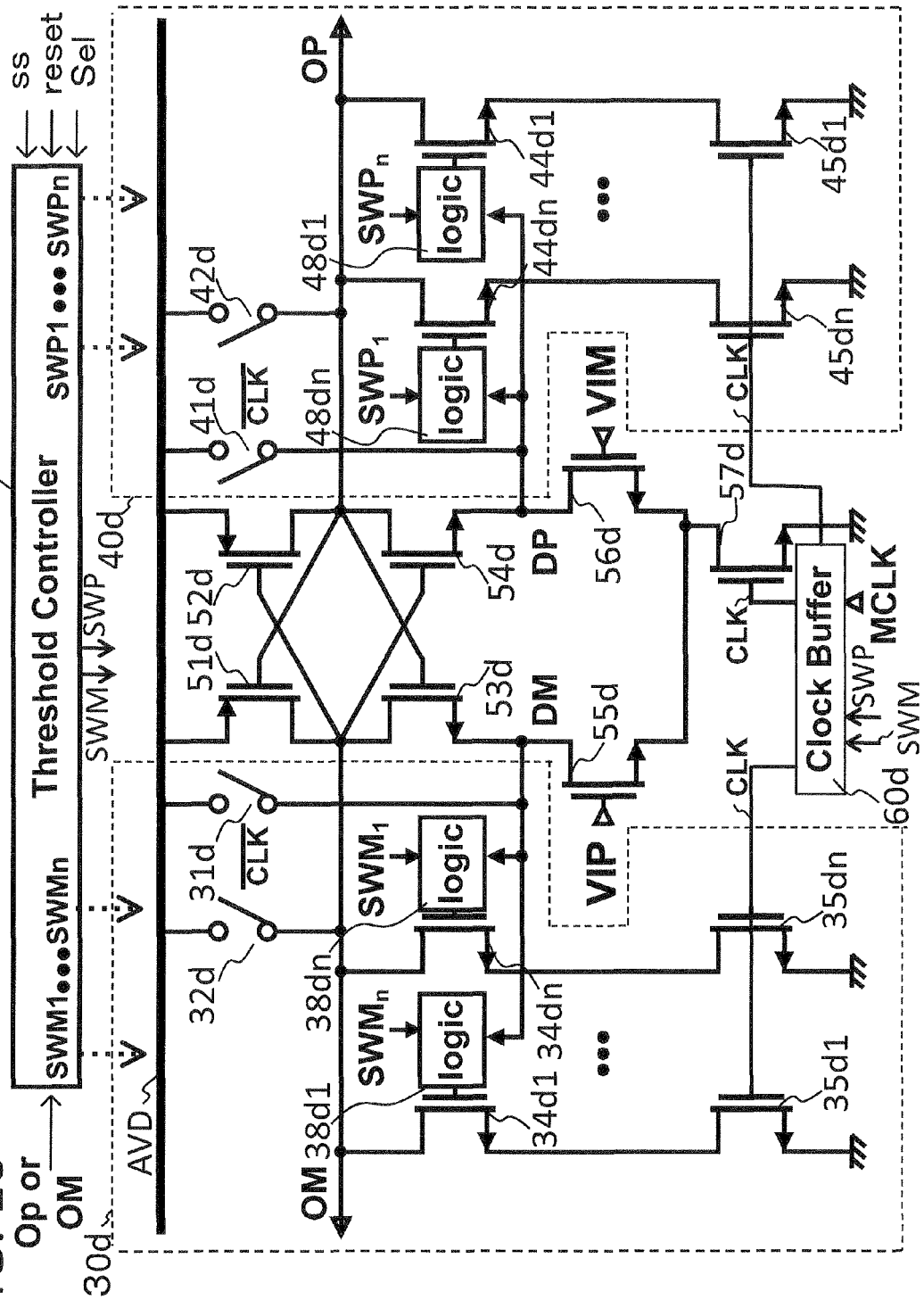
FIG. 10 is a circuit diagram illustrating a comparator of a fifth embodiment.

FIG. 10 is a circuit diagram illustrating a comparator 10d according to a fifth embodiment. The comparator 10d includes a threshold controller 20d, an offset cancel unit 30d, an offset cancel unit 40d, pMOS transistors 51d and 52d, nMOS transistors 53d, 54d, 55d, and 56d, a switch 57d, and a clock buffer 60d.

The comparator 10d has a function for performing an operation for comparing an input signal VIP and an input signal VIM, i.e., a function for performing an operation for amplifying a difference between potentials of an input signal VIP and an input signal VIM. The comparator 10d is capable of performing an operation for calibrating its own offset.

The pMOS transistors 51d and 52d and the nMOS transistors 53d, 54d, 55d, and 56d are similar to the pMOS transistors 51 and 52 and the nMOS transistors 53, 54, 55, and 56 which are included in the comparator 10 of the first embodiment. There is no substantial differences in the connection relationships between the transistors, the connection relationships between a high-potential line AVD and a ground line, the operations, and the functions.

The switch 57d is an nMOS transistor, which has a drain coupled to sources of the nMOS transistors 55d and 56d, a source coupled to the ground line, and a gate that receives a clock signal CLK output from the clock buffer 60d. In accordance with the potential of the clock signal CLK, the switch 57d connects or disconnects the sources of the nMOS transistors 55d and 56d and the ground line.

The clock buffer 60d is a circuit for buffering a master clock signal MCLK and generating the clock signal CLK. The clock buffer 60d is described below with reference to FIG. 18.

The offset cancel unit 30d serves as a circuit that controls, in accordance with the potential of a node DM and digital signals SWM1 to SWMn from the threshold controller 20d, cancel current flowing from the first current path to the ground line via an output line through which an output signal OM is output.

The offset cancel unit 30d includes n logic circuits 38d1 to 38dn, n nMOS transistors 34d1 to 34dn having gates that receive signals output from the logic circuits 38d1 to 38dn, n switches 35d1 to 35dn, and switches 31d and 32d. The nMOS transistors 34d1 to 34dn have drains coupled to the output line of the output signal OM. The n switches 35d1 to 35dn are nMOS transistors, which have sources to which the ground line is coupled, drains to which sources of the nMOS transistors 34d1 to 34dn are coupled, and gates that receive the clock signal CLK from the clock buffer 60d. In accordance with the corresponding digital signals SWM1 to SWMn and the potential of the node DM, the logic circuits 38d1 to 38dn output signals. In accordance with the potentials of the corresponding output signals, the nMOS transistors 34d1 to 34dn enter on or off states.

When the logics of the digital signals SWM1 to SWMn connected to the logic circuits 38d1 to 38dn are "L", the logic circuits 38d1 to 38dn output logic "L" signals, and when the logics of the digital signals SWM1 to SWMn are "H", the logic circuits 38d1 to 38dn output signals having substantially the same potential as the node DM. Detailed configurations of the logic circuits 38d1 to 38dn are described below with reference to FIG. 17.

The switch 32d connects or disconnects the output line of the output signal OM and the high-potential line AVD. The switch 31d connects or disconnects the node DM and the high-potential line AVD. The switches 31d and 32d execute the connections or disconnections in accordance with the potential of an inverted logic signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20d controls the number of, of the n nMOS transistors 34d1 to 34dn, the nMOS transistors to be turned on or off.

As a result, the cancel current corresponding to the offset of the comparator 10d flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "L" and thus all of the n nMOS transistors 34d1 to 34dn are turned off. Consequently, the offset cancel unit 30d terminates the generation of the cancel current flowing between the output line of the output signal OM and the ground line.

The offset cancel unit 40d serves as a circuit that controls, in accordance with the potential of a node DP and digital signals SWP1 to SWPn from the threshold controller 20d, cancel current flowing from the second current path to the ground line via an output line through which an output signal OP is output.

The offset cancel unit 40d includes logic circuits 48d1 to 48dn, n nMOS transistors 44d1 to 44dn having gates that receive signals output from the logic circuits 48d1 to 48dn, n switches 45d1 to 45dn, and switches 41d and 42d. The nMOS transistors 44d1 to 44dn have drains coupled to the output line of the output signal OP. The n switches 45d1 to 45dn are nMOS transistors, which have sources to which the ground line is coupled, drains to which sources of the nMOS transistors 44d1 to 44dn are coupled, and gates that receive the clock signal CLK.

In accordance with the corresponding digital signals SWP1 to SWPn and the potential of the node DP, the logic circuits 48d1 to 48dn output signals. In accordance with the potentials of the corresponding output signals, the switches 44d1 to 44dn enter on or off states.

When the logics of the digital signals SWP1 to SWPn connected to the logic circuits 48d1 to 48dn are "L", the logic circuits 48d1 to 48dn output logic "L" signals, and when the logics of the digital signals SWP1 to SWPn are "H", the logic circuits 48d1 to 48dn output signals having substantially the same potential as the node DP. Detailed configurations of the logic circuits 48d1 to 48dn are described below with reference to FIG. 17.

The switch 42d connects or disconnects the output line of the output signal OP and the high-potential line AVD. The switch 41d connects or disconnects the node DP and the high-potential line AVD. The switches 41d and 42d execute the connections or disconnections in accordance with the potential of the inverted logic signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20d controls the number of, of the n switches 44d1 to 44dn, the switches to be turned on or off.

As a result, the cancel current corresponding to the offset of the comparator 10d flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "L" and thus all of the n nMOS transistors 44d1 to 44dn are turned off. Consequently, the offset cancel unit 40d terminates the generation of the cancel current flowing between the output line of the output signal OP and the ground line.

Compared with the threshold controller 20 described in the first embodiment, the threshold controller 20d has a circuit configuration and a function which are similar to those of the threshold controller 20, except that the threshold controller 20d outputs the digital signals SWM1 to SWMn and the digital signals SWP1 to SWPn instead of the code signals 36 and 46 for controlling the on/off states of the switches 331 to 33n and the switches 431 to 43n.

In the comparator 10 described in the first embodiment, the switches 331 to 33n and the switches 431 to 43n increase/reduce the amount of the cancel current. Since the switches 351 to 35n and 451 to 45n are turned on/off in response to the clock signal CLK, the period in which the offset cancel units 30 and 40 generate the cancel current is limited to the period in which the logic of the clock signal CLK is "H". In addition, since the nMOS transistors 341 to 34n receive the potential of the node DM and the nMOS transistors 441 to 44n receive the potential of the node DP during operation, the period in which the cancel current flows in the switches 331 to 33n and the switches 431 to 43n is limited.

As opposed to the first embodiment, in the comparator 10d of the fifth embodiment, the switches 35d1 to 35dn and 45d1 to 45dn are nMOS transistors, and the gates thereof receive the clock signal CLK. As a result, the switches 35d1 to 35dn and the switches 45d1 to 45dn limit the period in which the offset cancel units 30d and 40d generate the cancel current to the period in which the logic of the clock signal CLK is "H".

On the other hand, the nMOS transistors 34d1 to 34dn receive the output signals from the logic circuits 38d1 to 38dn, and no cancel current flows in the nMOS transistors 34d1 to 34dn connected to the logic circuits 38d1 to 38dn that output logic "L" signals. However, the period in which the cancel current flows in the nMOS transistors 34d1 to 34dn connected to the logic circuits 38d1 to 38dn that output signals having the same potential as the node DP is limited.

The nMOS transistors 44d1 to 44dn operates in the same manner described above, in accordance with the logics of the signals output from the logic circuits 48d1 to 48dn.

In the comparator 10d of the fifth embodiment, during the comparison operation, the offset cancel units 30d and 40d cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of nMOS transistors whose gates receive the input signals become "L". Thus, the offset cancel units 30d and 40d shut off supply of the current to the differential output nodes DM and DP. This results in a reduction in the amount of power consumed by the offset cancel operation of the comparator 10d.

Sixth Embodiment

Figure 11:
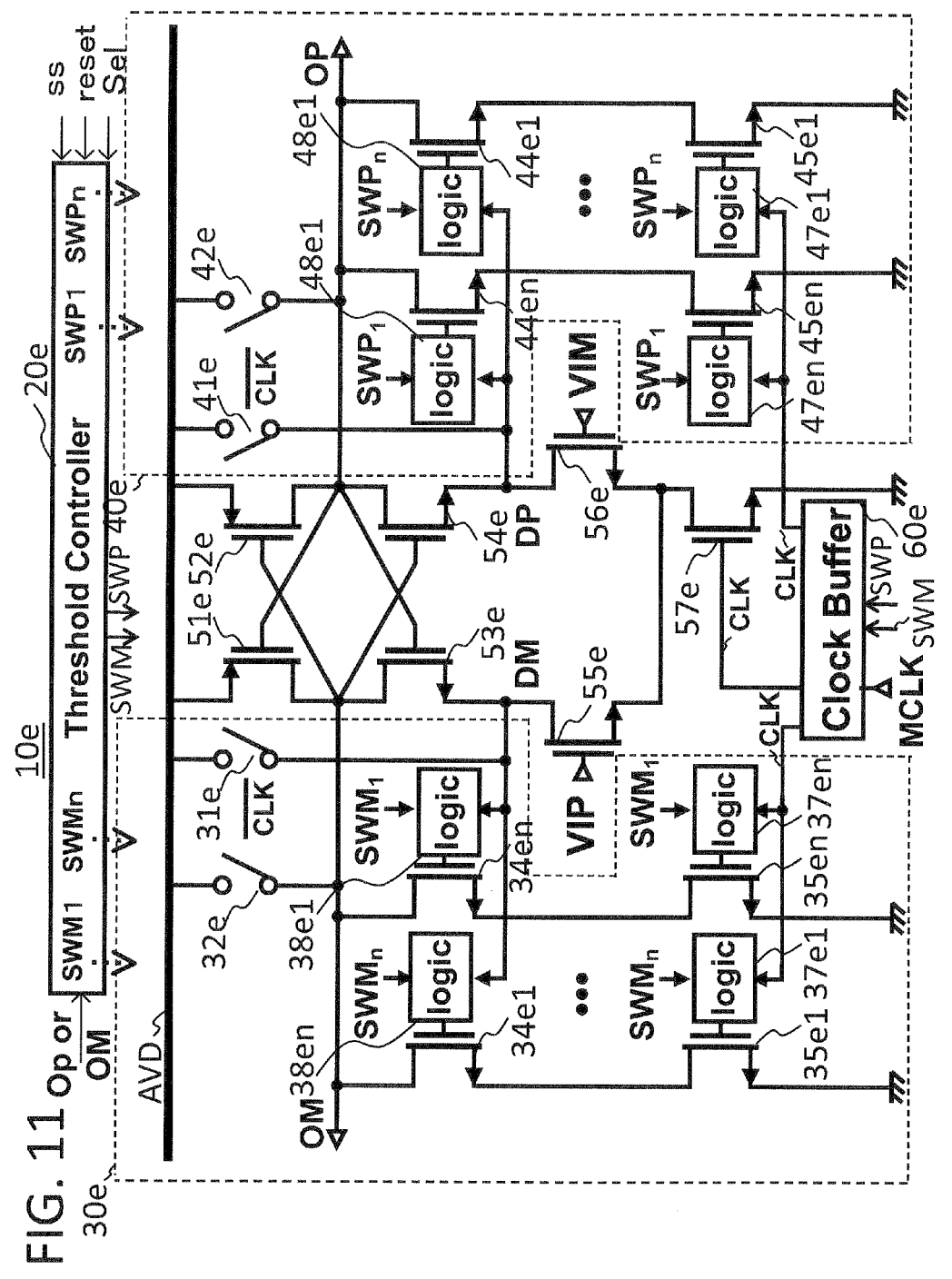

FIG. 11 is a circuit diagram illustrating a comparator 10e according to a sixth embodiment. The comparator 10e includes a threshold controller 20e, an offset cancel unit 30e, an offset cancel unit 40e, pMOS transistors 51e and 52e, nMOS transistors 53e, 54e, 55e, and 56e, a switch 57e, and a clock buffer 60e.

The comparator 10e has a function for performing an operation for comparing an input signal VIP and an input signal VIM, i.e., a function for performing an operation for amplifying a difference between potentials of an input signal VIP and an input signal VIM. The comparator 10e is also capable of performing an operation for calibrating its own offset.

The pMOS transistors 51e and 52e and the nMOS transistors 53e, 54e, 55e, and 56e are similar to the pMOS transistors 51 and 52 and the nMOS transistors 53, 54, 55, and 56 which are included in the comparator 10 of the first embodiment. There is no substantial differences in the connection relationships between the transistors, the connection relationships between a high-potential line AVD and a ground line, the operations, and the functions.

The switch 57e is an nMOS transistor, which has a drain coupled to sources of the nMOS transistors 55e and 56e, a source coupled to the ground line, and a gate that receives a clock signal CLK output from the clock buffer 60e. In accordance with the potential of the clock signal CLK, the switch 57e connects or disconnects the sources of the nMOS transistors 55e and 56e and the ground line.

The clock buffer 60e is a circuit for buffering a master clock signal MCLK and generating the clock signal CLK. The clock buffer 60e is described below with reference to FIG. 18.

The offset cancel unit 30e serves as a circuit that controls, in accordance with the potential of a node DM and digital signals SWM1 to SWMn from the threshold controller 20e, cancel current flowing from the first current path to the ground line via an output line through which an output signal OM is output.

The offset cancel unit 30e includes n logic circuits 37e1 to 37en, n logic circuits 38e1 to 38en, n nMOS transistors 34e1 to 34en having gates that receive signals output from the logic circuits 38e1 to 38en, n switches 35e1 to 35dn that operate in response to signals output from the logic circuits 37e1 to 37en, and switches 31e and 32e.

The nMOS transistors 34e1 to 34en have drains coupled to the output line of the output signal OM.

The n switches 35e1 to 35en are nMOS transistors, which have sources to which the ground line is coupled, drains to which sources of the nMOS transistors 34e1 to 34en are coupled, and gates that receive signals output from the logic circuits 37e1 to 37en.

In accordance with the corresponding digital signals SWM1 to SWMn and the potential of the clock signal CLK, the logic circuits 37e1 to 37en output signals. In accordance with the potentials of the corresponding output signals, the nMOS transistors 35e1 to 35en enter on or off states.

When the logics of the digital signals SWM1 to SWMn connected to the logic circuits 37e1 to 37en are "L", the logic circuits 37e1 to 37en output logic "L" signals, and when the logics of the digital signals SWM1 to SWMn are "H", the logic circuits 37e1 to 37en output signals having the same phase as the clock signal CLK. Detailed configurations of the logic circuits 37e1 to 37en are described below with reference to FIGS. 15 and 16.

In accordance with the corresponding digital signals SWM1 to SWMn and the potential of the node DM, the logic circuits 38e1 to 38en output signals. In accordance with the potentials of the corresponding output signals, the nMOS transistors 34e1 to 34en enter on or off states.

When the logics of the digital signals SWM1 to SWMn connected to the logic circuits 38e1 to 38en are "L", the logic circuits 38e1 to 38en output logic "L" signals, and when the logics of the digital signals SWM1 to SWMn are "H", the logic circuits 38e1 to 38en output signals having substantially the same potential as the node DM. Detailed configurations of the logic circuits 38e1 to 38en are described below with reference to FIG. 17.

The switch 32e connects or disconnects the output line of the output signal OM and the high-potential line AVD. The switch 31e connects or disconnects the node DM and the high-potential line AVD. The switches 31e and 32e execute the connections or disconnections in accordance with the potential of an inverted signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20e controls the number of, of the n nMOS transistors 34e1 to 34en, the nMOS transistors to be turned on or off.

As a result, the cancel current corresponding to the offset of the comparator 10e flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "L" and thus all of the n nMOS transistors 34e1 to 34en are turned off. Consequently, the offset cancel unit 30e terminates the generation of the cancel current flowing between the output line of the output signal OM and the ground line.

The offset cancel unit 40e serves as a circuit that controls, in accordance with the potential of a node DP and digital signals SWP1 to SWPn from the threshold controller 20e, cancel current flowing from the second current path to the ground line via an output line through which an output signal OP is output.

The offset cancel unit 40e includes n logic circuits 47e1 to 47en, n logic circuits 48e1 to 48en, n nMOS transistors 44e1 to 44en having gates that receive signals output from the logic circuits 48e1 to 48en, n switches 45e1 to 45en that receive signals output from the logic circuits 47e1 to 47en, and switches 41e and 42e.

The nMOS transistors 44e1 to 44en have drains coupled to the output line of the output signal OP.

The n switches 45e1 to 45en are nMOS transistors, which have sources to which the ground line is coupled, drains to which sources of the nMOS transistors 44e1 to 44en are coupled, and gates to which signals output from the logic circuits 47e1 to 47en are connected.

In accordance with the corresponding digital signals SWM1 to SWMn and the potential of the clock signal CLK, the logic circuits 47e1 to 47en output signals. In accordance with the potentials of the corresponding output signals, the nMOS transistors 44e1 to 44en enter on or off states.

When the logics of the digital signals SWP1 to SWPn connected to the logic circuits 47e1 to 47en are "L", the logic circuits 47e1 to 47en output logic "L" signals, and when the logics of the digital signals SWP1 to SWPn are "H", the logic circuits 47e1 to 47en output signals having the same phase as the clock signal CLK. Detailed configurations of the logic circuits 47e1 to 47en are described below with reference to FIGS. 15 and 16.

In accordance with the corresponding digital signals SWP1 to SWPn and the potential of the node DP, the logic circuits 48e1 to 48en output signals. In accordance with the potentials of the corresponding signals, the switches 44e1 to 44en enter on or off states.

When the logics of the digital signals SWP1 to SWPn connected to the logic circuits 48e1 to 48en are "L", the logic circuits 48e1 to 48en output logic "L" signals, and when the logics of the digital signals SWP1 to SWPn are "H", the logic circuits 48e1 to 48en output signals having substantially the same potential as the node DP. Detailed configurations of the logic circuits 48e1 to 48en are described below with reference to FIG. 17.

The switch 42e connects or disconnects the output line of the output signal OP and the high-potential line AVD. The switch 41e connects or disconnects the node DP and the high-potential line AVD. The switches 41e and 42e execute the connections or disconnections in accordance with the potential of the inverted signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20*e* controls the number of, of the n nMOS transistors 44*e*1 to 44*en*, the nMOS transistors to be turned on or off.

As a result, the cancel current corresponding to the offset of the comparator 10*e* flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "L" and thus all of the n nMOS transistors 44*e*1 to 44*en* are turned off. Consequently, the offset cancel unit 40*d* terminates the generation of the cancel current flowing between the output line of the output signal OP and the ground line.

Compared with the threshold controller 20 described in the first embodiment, the threshold controller 20*e* has a circuit configuration and a function which are similar to those of the threshold controller 20, except that the threshold controller 20*e* outputs the digital signals SWM1 to SWMn and the digital signals SWP1 to SWPn instead of the code signals 36 and 46 for controlling the on/off states of the switches 331 to 33*n* and the switches 431 to 43*n*.

In the comparator 10 described in the first embodiment, the switches 331 to 33*n* and the switches 431 to 43*n* increase/reduce the amount of the cancel current. Since the switches 351 to 35*n* and 451 to 45*n* are turned on/off in response to the clock signal CLK, the period in which the offset cancel units 30 and 40 generate the cancel current is limited to the period in which the logic of the clock signal CLK is "H". In addition, since the nMOS transistors 341 to 34*n* receive the potential of the node DM and the nMOS transistors 441 to 44*n* receive the potential of the node DP during operation, the period in which the cancel current flows in the switches 331 to 33*n* and the switches 431 to 43*n* is limited.

As opposed to the first embodiment, in the comparator 10*e* of the sixth embodiment, the switches 35*e*1 to 35*en* and the switches 45*e*1 to 45*en* are nMOS transistors, and the gates thereof receive corresponding outputs from the logic circuits 37*e*1 to 37*en* and the logic circuits 47*e*1 to 47*en*. As a result, the switches 35*e*1 to 35*en* and the switches 45*e*1 to 45*en* increase/reduce the amount of the cancel current and also limit the period in which the offset cancel units 30*e* and 40*e* generate the cancel current to the period in which the logic of the clock signal CLK is "H".

On the other hand, since the sources of the nMOS transistors 34*e*1 to 34*en* receive the signals output from the logic circuits 38*e*1 to 38*en*, no cancel current flows in the nMOS transistors 34*e*1 to 34*en* when the logic circuits 38*e*1 to 38*en* output logic "L" signals. However, when the logic circuits 38*e*1 to 38*en* output signals having potentials that are similar to that of the node DM, the period in which the cancel current flows in the nMOS transistors 34*e*1 to 34*en* is limited.

The nMOS transistors 44*e*1 to 44*en* operates in the same manner described above, in accordance with the logics of the signals output from the logic circuits 48*e*1 to 48*en*.

In the comparator 10*e* of the sixth embodiment, during the comparison operation, the offset cancel units 30*e* and 40*e* cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of nMOS transistors whose gates receive the input signals become "L". Thus, the offset cancel units 30*e* and 40*e* shut off supply of the current to the differential output nodes DM and DP. This results in a reduction in the amount of power consumed by the offset cancel operation of the comparator 10*e*.

Seventh Embodiment

Figure 12:
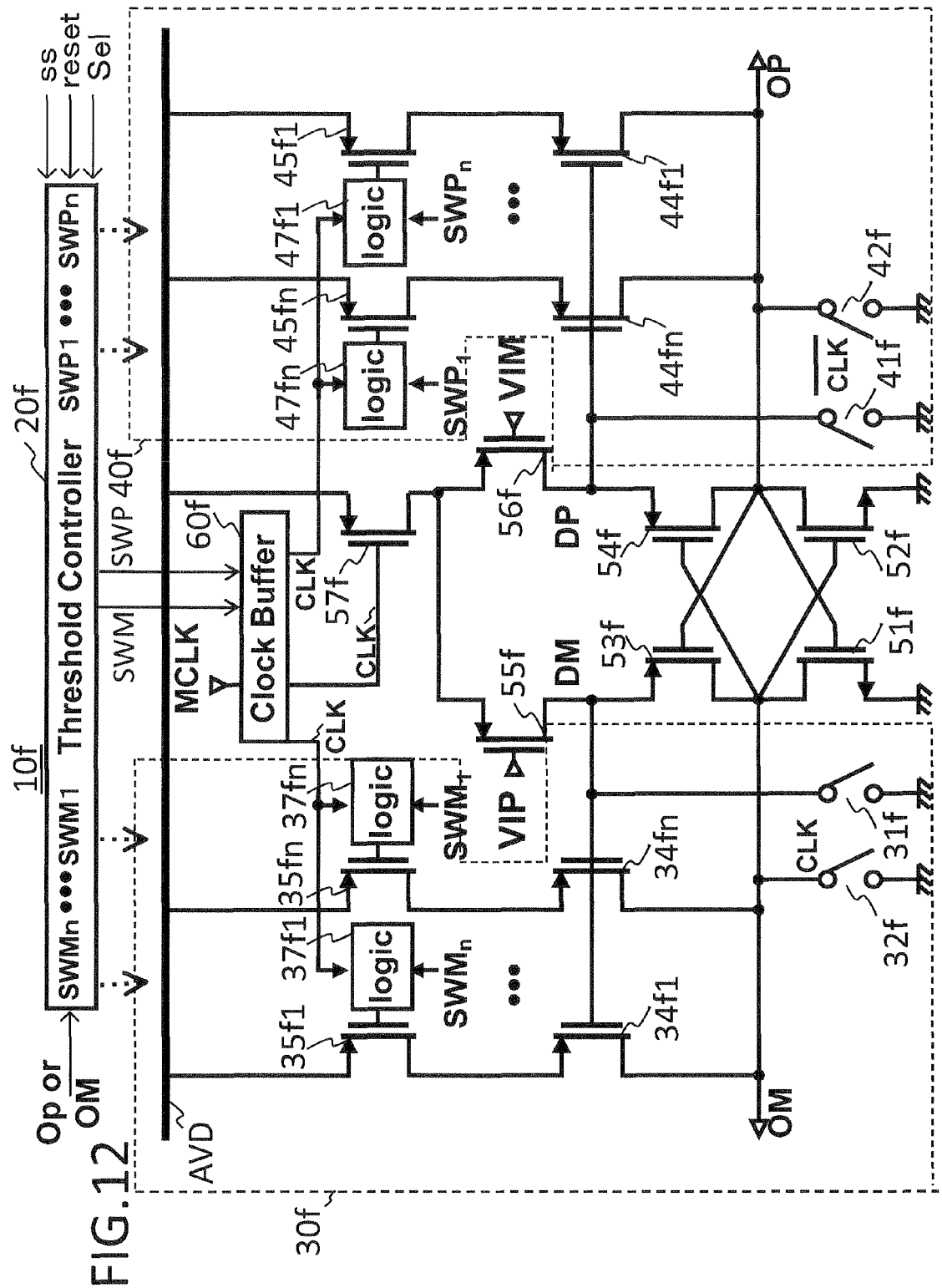
FIG. 12 is a circuit diagram illustrating a comparator of a seventh embodiment.

FIG. 12 is a circuit diagram illustrating a comparator 10*f* according to a seventh embodiment. The comparator 10*f* includes a threshold controller 20*f*, an offset cancel unit 30*f*, an offset cancel unit 40*f*, nMOS transistors 51*f* and 52*f*, pMOS transistors 53*f*, 54*f*, 55*f*, and 56*f*, a switch 57*f*, and a clock buffer 60*f*.

The comparator 10*f* has a function for performing an operation for comparing an input signal VIP and an input signal VIM, i.e., a function for performing an operation for amplifying a difference between potentials of an input signal VIP and an input signal VIM. The comparator 10*f* further has a function for performing an operation for calibrating its own offset.

The nMOS transistors 51*f* and 52*f* and the pMOS transistors 53*f*, 54*f*, 55*f*, and 56*f* are similar to the nMOS transistors 51*b* and 52*b* and the pMOS transistors 53*b*, 54*b*, 55*b*, and 56*b* which are included in the comparator of the second embodiment. There is no substantial differences in the connection relationships between the transistors, the connection relationships between a high-potential line AVD and a ground line, the operations, and the functions.

The switch 57*f* is a pMOS transistor, which has a drain coupled to sources of the pMOS transistors 55*f* and 56*f*, a source coupled to a high-potential line AVD, and a gate that receives a clock signal CLK output from the clock buffer 60*f*. In accordance with the potential of the clock signal CLK, the switch 57*f* connects or disconnects the sources of the pMOS transistors 55*f* and 56*f* and the high-potential line AVD.

The clock buffer 60*f* is a circuit for buffering a master clock signal MCLK and generating the clock signal CLK. The clock buffer 60*f* is described below with reference to FIG. 18.

The offset cancel unit 30*f* serves as a circuit that controls, in accordance with the potential of a node DM and digital signals SWM1 to SWMn from the threshold controller 20*f*, cancel current flowing from the first current path to the high-potential line AVD via an output line through which an output signal OM is output.

The offset cancel unit 30*f* includes logic circuits 37*f*1 to 37*fn*, n pMOS transistors 34*f*1 to 34*fn* having gates to which the node DM is coupled, n pMOS transistors 35*f*1 to 35*fn* having gates that receive outputs from the logic circuits 37*f*1 to 37*fn*, and switches 31*f* and 32*f*. The pMOS transistors 34*f*1 to 34*fn* have drains coupled to the output line of the output signal OM. The n switches 35*f*1 to 35*fn* are pMOS transistors, which have sources to which the high-potential line AVD is coupled, drains to which sources of the pMOS transistors 34*f*1 to 34*fn* are coupled, and the gates to which signals output from the logic circuits 37*f*1 to 37*fn* are connected. In accordance with the corresponding digital signals SWM1 to SWMn and the potential of the clock signal CLK, the logic circuits 37*f*1 to 37*fn* output signals. In accordance with the potentials of the corresponding output signals, the switches 35*f*1 to 35*fn* enter on or off states. When the logics of the digital signals SWM1 to SWMn connected to the logic circuits 37*f*1 to 37*fn* are "L", the logic circuits 37*f*1 to 37*fn* output logic "H" signals, and when the logics of the digital signals SWM1 to SWMn are "H", the logic circuits 37*f*1 to 37*fn* output signals having the same logic as the clock signal CLK. Detailed configurations of the logic circuits 37*f*1 to 37*fn* are described below with reference to FIGS. 15 and 16.

The switch 32*f* connects or disconnects the output line of the output signal OM and the ground line. The switch 31*f* connects or disconnects the node DM and the ground line. The switches 31*f* and 32*f* execute the connections or disconnections in accordance with the potential of an inverted logic signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20*f* controls the number of, of the n switches 35*f*1 to 35*fn*, the switches to be turned on or off.

As a result, the cancel current corresponding to the offset of the comparator 10*f* flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "H" and thus all of the n pMOS transistors 35*f*1 to 35*fn* are turned off. Consequently, the offset cancel unit 30*f* terminates the generation of the cancel current flowing between the output line of the output signal OM and the high-potential line AVD.

The offset cancel unit 40*f* serves as a circuit that controls, in accordance with the potential of a node DP and digital signals SWP1 to SWPn from the threshold controller 20*f*, cancel current flowing from the second current path to the ground line via an output line through which an output signal OP is output.

The offset cancel unit 40*f* includes logic circuits 47*f*1 to 47*fn*, n pMOS transistors 44*f*1 to 44*fn* having gates to which the node DP is coupled, n switches 45*f*1 to 45*fn* having gates that receive outputs from the logic circuits 47*f*1 to 47*fn*, and switches 41*f* and 42*f*. The pMOS transistors 44*f*1 to 44*fn* have drains coupled to the output line of the output signal OP.

The n switches 45*f*1 to 45*fn* are pMOS transistors, which have sources to which the high-potential line AVD is coupled, drains to which sources of the pMOS transistors 44*f*1 to 44*fn* are coupled, and the gates to which signals output from the logic circuits 47*f*1 to 47*fn* are connected. In accordance with corresponding digital signals SWP1 to SWPn and the potential of the clock signal CLK, the logic circuits 47*f*1 to 47*fn* output signals. In accordance with the potentials of the corresponding output signals, the switches 45*f*1 to 45*fn* enter on or off states. When the logics of the digital signals SWP1 to SWPn connected to the logic circuits 47*f*1 to 47*fn* are "L", the logic circuits 47*f*1 to 47*fn* output logic "H" signals, and when the logics of the digital signals SWP1 to SWPn are "H", the logic circuits 47*f*1 to 47*fn* output signals having the same logic as the clock signal CLK. Detailed configurations of the logic circuits 47*f*1 to 47*fn* are described below with reference to FIGS. 15 and 16.

The switch 42*f* connects or disconnects the output line of the output signal OP and the ground line. The switch 41*f* connects or disconnects the node DP and the ground line. The switches 41*f* and 42*f* execute the connections or disconnections in accordance with the potential of the inverted logic signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20*f* controls the number of, of the n switches 45*f*1 to 45*fn*, the switches to be turned on or off.

As a result, the cancel current corresponding to the offset of the comparator 10*f* flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "L" and thus all of the n nMOS transistors 45*f*1 to 45*fn* are turned off. This results in shut off of the cancel current that is generated by the offset cancel unit 40*f* and that flows between the output line of the output signal OP and the high-potential line AVD.

Compared with the threshold controller 20*b* described in the second embodiment, the threshold controller 20*f* has a circuit configuration and a function which are similar to those of the threshold controller 20*b*, except that the threshold controller 20*f* outputs the digital signals SWM1 to SWMn and the digital signals SWP1 to SWPn instead of the code signals 36*b* and 46*b* for controlling the on/off states of the switches 33*b*1 to 33*bn* and the switches 43*b*1 to 43*bn*.

As described above, in the comparator 10*b* of the second embodiment, the switches 33*b*1 to 33*bn* and the switches 43*b*1 to 43*bn* increase/reduce the amount of the cancel current. Further, since the switches 35*l* to 35*n* and 45*l* to 45*n* are turned on/off in response to the clock signal CLK, the period in which the offset cancel units 30*b* and 40*b* generate the cancel current is limited to the period in which the logic of the clock signal CLK is "L". In addition, since the pMOS transistors 34*b*1 to 34*bn* receive the potential of the node DMb and the pMOS transistors 44*b*1 to 44*bn* receive the potential of the node DPb during operation, the period in which the cancel current flows in the switches 33*b*1 to 33*bn* and the switches 43*b*1 to 43*bn* is limited.

As opposed to the second embodiment, in the comparator 10*f* of the seventh embodiment, the switches 35*f*1 to 35*fn* and the switches 45*f*1 to 45*fn* are pMOS transistors, and the gates thereof receive corresponding signals output from the logic circuits 37*f*1 to 37*fn* and the logic circuits 47*f*1 to 47*fn*. As a result, the switches 35*f*1 to 35*fn* and the switches 45*f*1 to 45*fn* increase/reduce the amount of the cancel current and also limit the period in which the offset cancel units 30*f* and 40*f* generate the cancel current to the period in which the logic of the clock signal CLK is "L".

On the other hand, since the pMOS transistors 34*f*1 to 34*fn* receive the potential of the node DM and the pMOS transistors 44*f*1 to 44*fn* receive the potential of the node DP during operation, the period in which the cancel current flows in the switches 34*f*1 to 34*fn* and the switches 44*f*1 to 44*fn* is limited.

With this arrangement, in the comparator 10*f* of the seventh embodiment, during the comparison operation, the offset cancel units 30*f* and 40*f* cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of pMOS transistors whose gates receive the input signals become "H". Thus, the offset cancel units 30*f* and 40*f* shut off supply of the current to the differential output nodes DM and DP. This results in a reduction in the amount of power consumed by the offset cancel operation of the comparator 10*f*.

Eighth Embodiment

Figure 13:
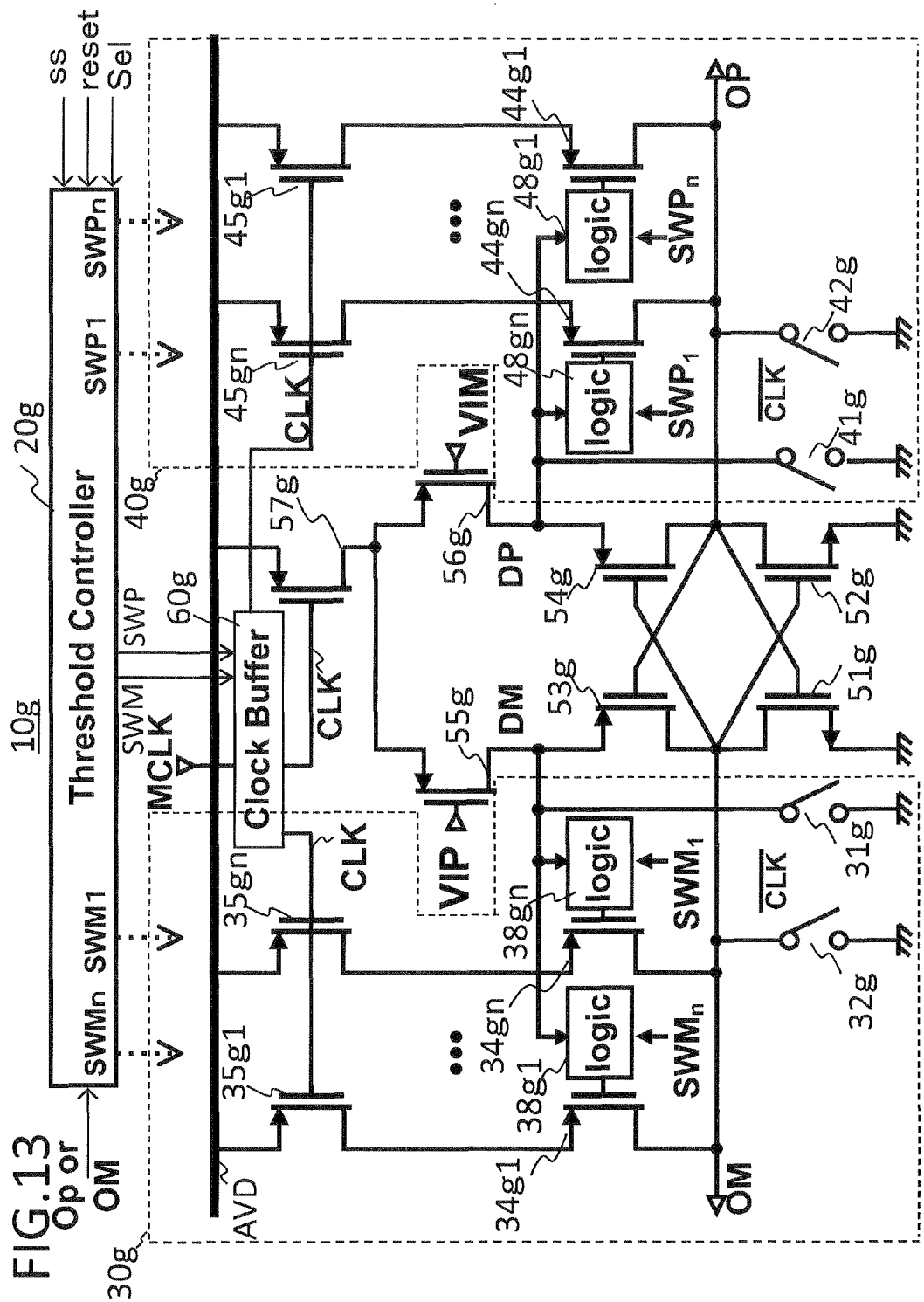
FIG. 13 is a circuit diagram illustrating a comparator of an eighth embodiment.

FIG. 13 is a circuit diagram illustrating a comparator 10*g* according to an eighth embodiment. The comparator 10*g* includes a threshold controller 20*g*, an offset cancel unit 30*g*, an offset cancel unit 40g, nMOS transistors 51g and 52g, pMOS transistors 53g, 54g, 55g, and 56g, a switch 57g, and a clock buffer 60g.

The comparator 10g has a function for performing an operation for comparing an input signal VIP and an input signal VIM, i.e., a function for performing an operation for amplifying a difference between potentials of an input signal VIP and an input signal VIM. The comparator 10g further has a function for performing an operation for calibrating its own offset.

The nMOS transistors 51g and 52g and the pMOS transistors 53g, 54g, 55g, and 56g are similar to the nMOS transistors 51b and 52b and the pMOS transistors 53b, 54b, 55b, and 56b which are included in the comparator of the second embodiment. There is no substantial differences in the connection relationships between the transistors, the connection relationships between a high-potential line AVD and a ground line, the operations, and the functions.

The switch 57g is a pMOS transistor, which has a drain coupled to sources of the pMOS transistors 55g and 56g, a source coupled to a high-potential line AVD, and a gate that receives a clock signal CLK output from the clock buffer 60g. In accordance with the potential of the clock signal CLK, the switch 57g connects or disconnects the sources of the pMOS transistors 55g and 56g and the high-potential line AVD.

The clock buffer 60g is a circuit for buffering a master clock signal MCLK and generating the clock signal CLK. The clock buffer 60g is described below with reference to FIG. 18.

The offset cancel unit 30g serves as a circuit that controls, in accordance with the potential of a node DM and digital signals SWM1 to SWMn from the threshold controller 20g, cancel current flowing from the first current path to the high-potential line AVD via an output line through which an output signal OM is output.

The offset cancel unit 30g includes logic circuits 38g1 to 38gn, n pMOS transistors 34g1 to 34gn having gates that receive signals output from the logic circuits 38g1 to 38gn, n switches 35g1 to 35gn, and switches 31g and 32g. The pMOS transistors 34g1 to 34gn have drains coupled to the output line of the output signal OM. The n switches 35g1 to 35gn are pMOS transistors, which have sources to which the high-potential line AVD is coupled, drains to which sources of the pMOS transistors 34g1 to 34gn are coupled, and gates that receive the clock signal CLK from the clock buffer 60g.

In accordance with the corresponding digital signals SWM1 to SWMn and the potential of the node DM, the logic circuits 38g1 to 38gn output signals. In accordance with the potentials of the corresponding signals, the switches 34g1 to 34gn enter on or off states.

When the logics of the digital signals SWM1 to SWMn connected to the logic circuits 38g1 to 38gn are "L", the logic circuits 38g1 to 38gn output logic "H" signals, and when the logics of the digital signals SWM1 to SWMn are "H", the logic circuits 38g1 to 38gn output signals having potentials that are similar to that of the node DM. Detailed configurations of the logic circuits 38g1 to 38gn are described below with reference to FIG. 17.

The switch 32g connects or disconnects the output line of the output signal OM and the ground line. The switch 31g connects or disconnects the node DM and the ground line. The switches 31g and 32g execute the connections or disconnections in accordance with the potential of an inverted logic signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20g controls the number of, of the n pMOS transistors 34g1 to 34gn, the pMOS transistors to be turned on or off.

As a result, the cancel current corresponding to the offset of the comparator 10g flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "H" and thus all of the n pMOS transistors 34g1 to 34gn are turned off. Consequently, the offset cancel unit 30g terminates the generation of the cancel current flowing between the output line of the output signal OM and the high-potential line AVD.

The offset cancel unit 40g serves as a circuit that controls, in accordance with the potential of a node DP and digital signals SWP1 to SWPn from the threshold controller 20g, cancel current flowing from the second current path to the ground line via an output line through which an output signal OP is output.

The offset cancel unit 40g includes logic circuits 48g1 to 48gn, n pMOS transistors 44g1 to 44gn having gates that receive signals output from the logic circuits 48g1 to 48gn, n switches 45g1 to 45gn, and switches 41g and 42g. The pMOS transistors 44g1 to 44gn have drains coupled to the output line of the output signal OR The n switches 45g1 to 45gn are pMOS transistors, which have sources to which the high-potential line AVD is coupled, drains to which sources of the pMOS transistors 44g1 to 44gn are coupled, and gates that receive the clock signal CLK from the clock buffer 60g.

In accordance with the corresponding digital signals SWP1 to SWPn and the potential of the node DP, the logic circuits 48g1 to 48gn output signals. In accordance with the potentials of the corresponding output signals, the switches 44g1 to 44gn that are pMOS transistors enter on or off states.

When the logics of the digital signals SWP1 to SWPn connected to the logic circuits 48g1 to 48gn are "L", the logic circuits 48g1 to 48gn output logic "H" signals, and when the logics of the digital signals SWP1 to SWPn are "H", the logic circuits 48g1 to 48gn output signals having the same logic as the clock CLK. Detailed configurations of the logic circuits 48g1 to 48gn are described below with reference to FIG. 17.

The switch 42g connects or disconnects the output line of the output signal OP and the ground line. The switch 41g connects or disconnects the node DP and the ground line. The switches 41g and 42g execute the connections or disconnections in accordance with the potential of the inverted logic signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20g controls the number of, of the n pMOS transistors 44g1 to 44gn, the pMOS transistors to be turned on or off.

As a result, the cancel current corresponding to the offset of the comparator 10g flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "H" and thus all of the n pMOS transistors 44g1 to 44gn are turned off. This results in shut off of the cancel current that is generated by the offset cancel unit 40g and that flows between the output line of the output signal OP and the high-potential line AVD.

Compared with the threshold controller 20b described in the second embodiment, the threshold controller 20g has a circuit configuration and a function which are similar to those of the threshold controller 20b, except that the threshold controller 20g outputs the digital signals SWM1 to SWMn and the digital signals SWP1 to SWPn instead of the code signals 36b and 46b for controlling the on/off states of the switches 33b1 to 33bn and the switches 43b1 to 43bn.

As described above, in the comparator 10b of the second embodiment, the switches 33b1 to 33bn and the switches 43b1 to 43bn increase/reduce the amount of the cancel current. Further, since the switches 35l to 35n and 45l to 45n are turned on/off in response to the clock signal CLK, the period in which the offset cancel units 30b and 40b generate the cancel current is limited to the period in which the logic of the clock signal CLK is "L". In addition, since the pMOS transistors 34b1 to 34bn receive the potential of the node DMb and the pMOS transistors 44b1 to 44bn receive the potential of the node DPb during operation, the period in which the cancel current flows in the switches 33b1 to 33bn and the switches 43b1 to 43bn is limited.

As opposed to the second embodiment, in the comparator 10g of the eighth embodiment, the switches 35g1 to 35gn and 45g1 to 45gn are pMOS transistors, and the gates thereof receive the clock signal CLK output from the clock buffer 60g. As a result, the switches 35g1 to 35gn and the switches 45g1 to 45gn limit the period in which the offset cancel units 30g and 40g generate the cancel current to the period in which the logic of the clock signal CLK is "L".

On the other hand, the pMOS transistors 34g1 to 34gn receive the signals output from the logic circuits 38g1 to 38gn via the gates and, by using the digital signals SWP1 to SWPn, the threshold controller 20g controls the number of, of the n pMOS transistors 34g1 to 34gn, the pMOS transistors to be turned on/off. Thus, the amount of the cancel current increases/decreases and the period in which the offset cancel unit 30g generates the cancel current is limited to the period in which the logic of the clock signal CLK is "L". The pMOS transistors 44g1 to 44gn also operates when the gates thereof receive corresponding signals output from the logic circuits 48g1 to 48gn, so that the amount of the cancel current generated by the offset cancel unit 40g increases/decreases and the period in which the offset cancel unit 40g generates the cancel current is limited to the period in which the logic of the clock signal CLK is "H".

With this arrangement, in the comparator 10g of the eighth embodiment, during the comparison operation, the offset cancel units 30g and 40g cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of pMOS transistors whose gates receive the input signals become "H". Thus, the offset cancel units 30g and 40g shut off supply of the current to the differential output nodes DM and DP. This results in a reduction in the amount of power consumed by the offset cancel operation of the comparator 10g.

Ninth Embodiment

Figure 14:
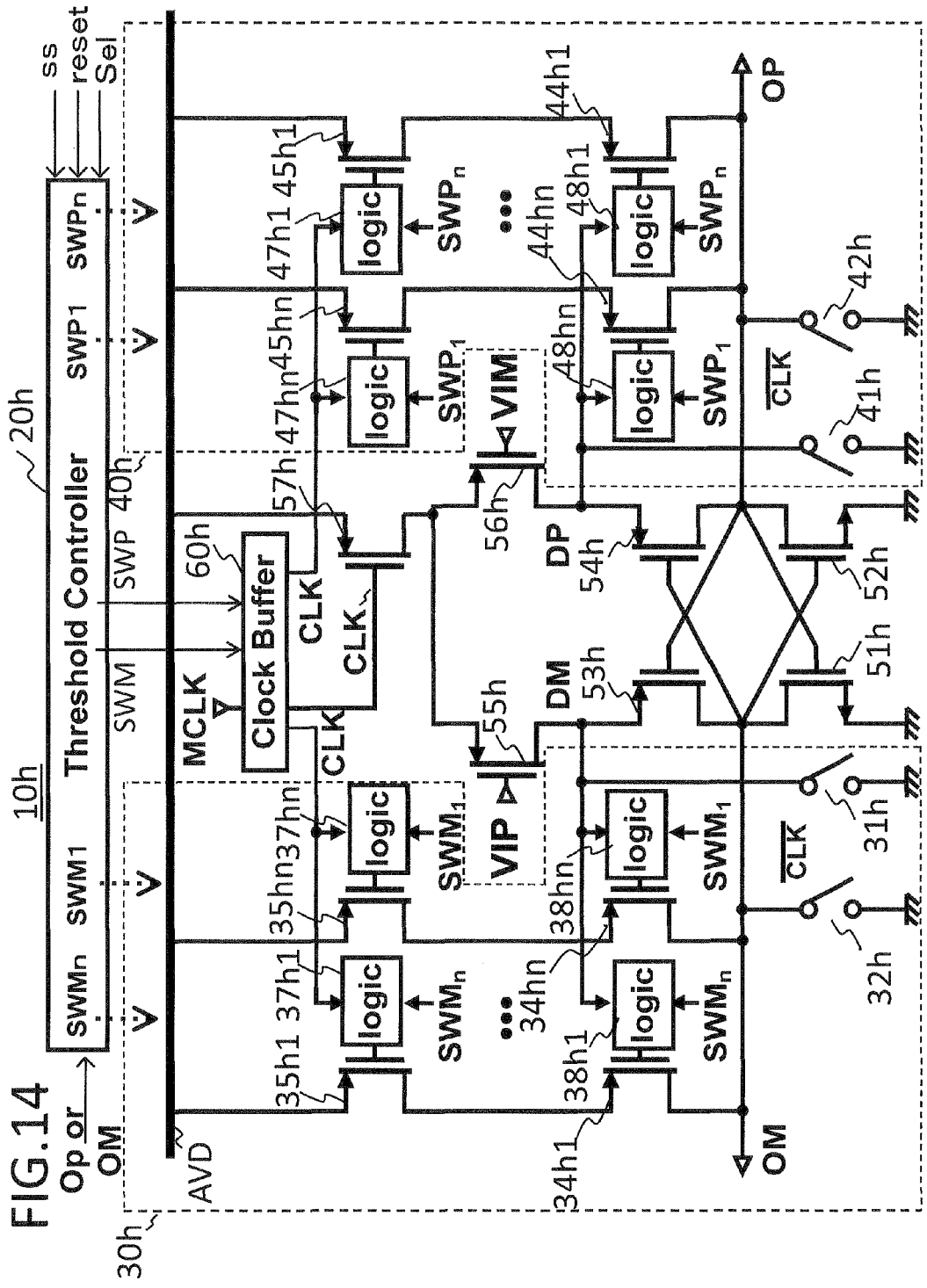
FIG. 14 is a circuit diagram illustrating a comparator of a ninth embodiment.

FIG. 14 is a circuit diagram illustrating a comparator 10h according to a ninth embodiment. The comparator 10h includes a threshold controller 20h, an offset cancel unit 30h, an offset cancel unit 40h, nMOS transistors 51h and 52h, pMOS transistors 53h, 54h, 55h, and 56h, a switch 57h, and a clock buffer 60h.

The comparator 10h has a function for performing an operation for comparing an input signal VIP and an input signal VIM, i.e., a function for performing an operation for amplifying a difference between potentials of an input signal VIP and an input signal VIM. The comparator 10h is also capable of performing an operation for calibrating its own offset.

The nMOS transistors 51h and 52h and the pMOS transistors 53h, 54h, 55h, and 56h are similar to the nMOS transistors 51h and 52h and the pMOS transistors 53h, 54h, 55h, and 56h which are included in the comparator 10h of the second embodiment. There is no substantial differences in the connection relationships between the transistors, the connection relationships between a high-potential line AVD and a ground line, the operations, and the functions.

The switch 57h is a pMOS transistor, which has a drain coupled to sources of the pMOS transistors 55h and 56h, a source coupled to a high-potential line AVD, and a gate that receives a clock signal CLK output from the clock buffer 60h. In accordance with the potential of the clock signal CLK, the switch 57h connects or disconnects the sources of the pMOS transistors 55h and 56h and the high-potential line AVD.

The clock buffer 60h is a circuit for buffering a master clock signal MCLK and generating the clock signal CLK. The clock buffer 60h is described below with reference to FIG. 18.

The offset cancel unit 30h serves as a circuit that controls, in accordance with the potential of a node DM and digital signals SWM1 to SWMn from the threshold controller 20h, cancel current flowing from the first current path to the ground line via an output line through which an output signal OM is output.

The offset cancel unit 30h includes n logic circuits 37h1 to 37hn, n logic circuits 38h1 to 38hn, n pMOS transistors 34h1 to 34hn having gates that receive signals output from the logic circuits 38h1 to 38hn, n switches 35h1 to 35hn that operate in response to signals output from the logic circuits 37h1 to 37hn, and switches 31h and 32h.

The pMOS transistors 34h1 to 34hn have drains coupled to the output line of the output signal OM.

The n switches 35h1 to 35hn are pMOS transistors, which have sources to which the ground line is coupled, drains to which the sources of the pMOS transistors 34h1 to 34hn are coupled, and gates that receive signals output from the logic circuits 37h1 to 37hn.

In accordance with the corresponding digital signals SWM1 to SWMn and the potential of the clock signal CLK, the logic circuits 37h1 to 37hn output signals. In accordance with the potentials of the corresponding output signals, the pMOS transistors 34h1 to 34hn enter on or off states.

When the logics of the digital signals SWM1 to SWMn connected to the logic circuits 37h1 to 37hn are "L", the logic circuits 37h1 to 37hn output logic "H" signals, and when the logics of the digital signals SWM1 to SWMn are "H", the logic circuits 37h1 to 37hn output signals having the same phase as the clock signal CLK. Detailed configurations of the logic circuits 37h1 to 37hn are described below with reference to FIGS. 15 and 16.

In accordance with the corresponding digital signals SWM1 to SWMn and the potential of the node DM, the logic circuits 38h1 to 38hn output signals. In accordance with the potentials of the corresponding output signals, the pMOS transistors 34h1 to 34hn enter on or off states.

When the logics of the digital signals SWM1 to SWMn connected to the logic circuits 38h1 to 38hn are "L", the logic circuits 38h1 to 38hn output logic "H" signals, and when the logics of the digital signals SWM1 to SWMn are "H", the logic circuits 38h1 to 38hn output signals having substantially the same potential as the node DM. Detailed configurations of the logic circuits 38h1 to 38hn are described below with reference to FIG. 17.

The switch 32h connects or disconnects the output line of the output signal OM and the ground line. The switch 31h connects or disconnects the node DM and the ground line. The switches 31h and 32h execute the connections or disconnections in accordance with the potential of an inverted logic signal /CLK of the clock signal CLK.

Each of the digital signals SWM1 to SWMn is a signal corresponding to the digits of an n-digit binary number and has a signal potential indicating a logic value. Using the digital signals SWM1 to SWMn, the threshold controller 20h controls the number of, of the n pMOS transistors 34h1 to 34hn, the pMOS transistors to be turned on or off.

As a result, the cancel current corresponding to the offset of the comparator 10h flows between the output line of the output signal OM and the ground line. When the potential of the output signal OM is fixed to the logic level indicating "H" or the logic level indicating "L" in accordance with the potential difference between the potential of the input signal VIP and the potential of the input signal VIM, the potential of the node DM becomes the logic level indicating "H" and thus all of the n pMOS transistors 34h1 to 34hn are turned off. Consequently, the offset cancel unit 30h terminates the generation of the cancel current flowing between the output line of the output signal OM and the ground line.

The offset cancel unit 40h serves as a circuit that controls, in accordance with the potential of a node DP and digital signals SWP1 to SWPn from the threshold controller 20h, cancel current flowing from the second current path to the ground line via an output line through which an output signal OP is output.

The offset cancel unit 40h includes n logic circuits 47h1 to 47hn, n logic circuits 48h1 to 48hn, n pMOS transistors 44h1 to 44hn having gates that receive signals output from the logic circuits 48h1 to 48hn, n switches 45h1 to 45hn that receive signals output from the logic circuits 47h1 to 47hn, and switches 41h and 42h.

The pMOS transistors 44h1 to 44hn have drains coupled to the output line of the output signal OP.

The n switches 45h1 to 45hn are pMOS transistors, which have sources to which the ground line is coupled, drains to which sources of the pMOS transistors 44h1 to 44hn are coupled, and gates to which signals output from the logic circuits 47h1 to 47hn are connected.

In accordance with the corresponding digital signals SWP1 to SWPn and the potential of the clock signal CLK, the logic circuits 47h1 to 47hn output signals. In accordance with the potentials of the corresponding output signals, the switches 45h1 to 45hn that are pMOS transistors enter on or off states.

When the logics of the digital signals SWP1 to SWPn connected to the logic circuits 47h1 to 47hn are "L", the logic circuits 47h1 to 47hn output logic "H" signals, and when the logics of the digital signals SWP1 to SWPn are "H", the logic circuits 47h1 to 47hn output signals having the same phase as the clock signal CLK. Detailed configurations of the logic circuits 47h1 to 47hn are described below with reference to FIGS. 15 and 16.

In accordance with the corresponding digital signals SWP1 to SWPn and the potential of the node DP, the logic circuits 48h1 to 48hn output signals. In accordance with the potentials of the corresponding output signals, the switches 44h1 to 44hn enter on or off states.

When the logics of the digital signals SWP1 to SWPn connected to the logic circuits 48h1 to 48hn are "L", the logic circuits 48h1 to 48hn output logic "H" signals, and when the logics of the digital signals SWP1 to SWPn are "H", the logic circuits 48h1 to 48hn output signals having substantially the same potential as the node DR Detailed configurations of the logic circuits 48h1 to 48hn are described below with reference to FIG. 17.

The switch 42h connects or disconnects the output line of the output signal OP and the ground line. The switch 41h connects or disconnects the node DP and the ground line. The switches 41h and 42h execute the connections or disconnections in accordance with the potential of the inverted logic signal /CLK of the clock signal CLK.

Each of the digital signals SWP1 to SWPn is a signal corresponding to the digits of an n-digit binary number and has a signal potential indicating a logic value. Using the digital signals SWP1 to SWPn, the threshold controller 20h controls the number of, of the n pMOS transistors 44h1 to 44hn, the pMOS transistors to be turned on or off.

As a result, the cancel current corresponding to the offset of the comparator 10h flows between the output line of the output signal OP and the ground line. When the potential of the output signal OP is fixed to the logic level indicating "H" or the logic level indicating "L" in accordance with the potential difference between the potential of the input signal VIP and the potential of the input signal VIM, the potential of the node DP becomes the logic level indicating "H" and thus all of the n pMOS transistors 44h1 to 44hn are turned off. Consequently, the offset cancel unit 40h terminates the generation of the cancel current flowing between the output line of the output signal OP and the ground line.

Compared with the threshold controller 20b described in the second embodiment, the threshold controller 20h has a circuit configuration and a function which are similar to those of the threshold controller 20b, except that the threshold controller 20h outputs the digital signals SWM1 to SWMn and the digital signals SWP1 to SWPn instead of the code signals 36b and 46b for controlling the on/off states of the switches 331 to 33n and the switches 431 to 43n.

As described above, in the comparator 10b of the second embodiment, the switches 33b1 to 33bn and the switches 43b1 to 43bn increase/reduce the amount of the cancel current. Further, since the switches 35b1 to 35bn and 45b1 to 45bn are turned on/off in response to the clock signal CLK, the period in which the offset cancel units 30b and 40b generate the cancel current is limited to the period in which the logic of the clock signal CLK is "H". In addition, since the pMOS transistors 34b1 to 34bn receive the potential of the node DMb and the pMOS transistors 44b1 to 44bn receive the potential of the node DPb during operation, the period in which the cancel current flows in the switches 33b1 to 33bn and the switches 43b1 to 43bn is limited.

As opposed to the second embodiment, in the comparator 10h of the ninth embodiment, the switches 35h1 to 35hn and the switches 45h1 to 45hn are pMOS transistors, and the gates thereof receive corresponding outputs from the logic circuits 37h1 to 37hn and the logic circuits 47h1 to 47hn. As a result, the switches 35h1 to 35hn and the switches 45h1 to 45hn increase/reduce the amount of the cancel current and also limit the period in which the offset cancel units 30h and 40h generate the cancel current to the period in which the logic of the clock signal CLK is "H".

On the other hand, since the gates of the pMOS transistors 34h1 to 34hn receive the output signals from the logic circuits 38h1 to 38hn, no cancel current flows in the pMOS transistors 34h1 to 34hn connected to the logic circuits 38h1 to 38hn that output logic "H" signals. However, with respect to the pMOS transistors 34h1 to 34hn coupled to the logic circuits 38h1 to 38hn that output signals having potentials that are similar to that of the node DP, the period in which the cancel current flows is limited to the period in which the potential of the node DP is higher than or equal to a threshold.

The pMOS transistors 44h1 to 44hn operates in the same manner described above, in accordance with the logics of the signals output from the logic circuits 48h1 to 48hn.

With this arrangement, in the comparator 10h of the ninth embodiment, during the comparison operation, the offset cancel units 30h and 40h cause the current to flow to the corresponding differential output nodes DM and DP so as to cancel an offset. However, during the comparison operation, when the potentials of the differential output nodes DM and DP are stabilized to indicate a certain logic, the logics of the potentials of the drains of the pair of pMOS transistors whose gates receive the input signals become "L". Thus, the offset cancel units 30e and 40e shut off supply of the current to the differential output nodes DM and DP. This results in a reduction in the amount of power consumed by the offset cancel operation of the comparator 10h.

Figure 15:
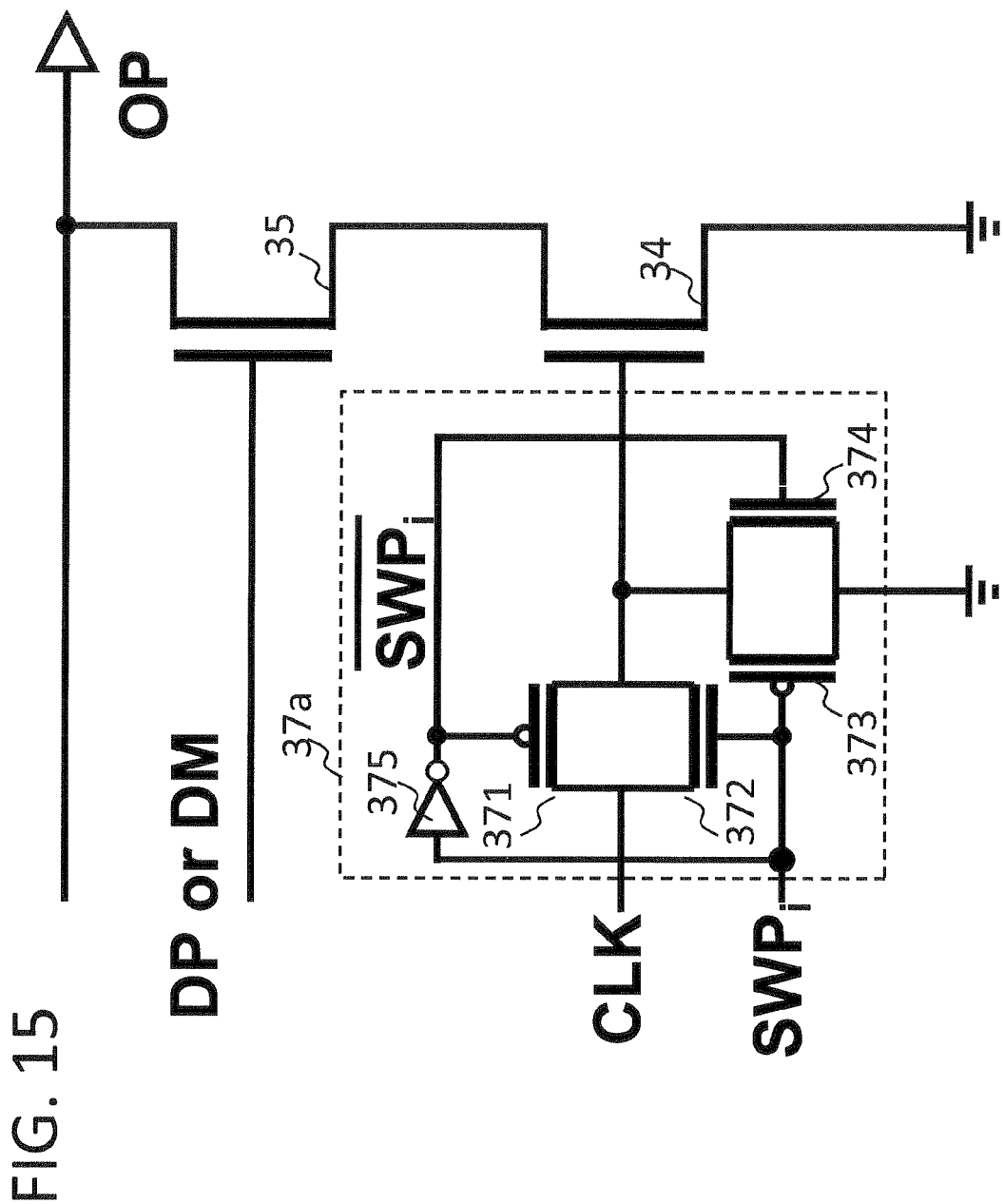
FIG. 15 is a diagram illustrating a logic circuit, which is a first circuit example of a logic circuit described in the fourth embodiment.

FIG. 15 is a diagram illustrating a logic circuit 37a, which is a first circuit example of the logic circuit 37c1 described in the fourth embodiment. FIG. 15 illustrates a signal line through which the output signal OP propagates, an nMOS transistor 35, an nMOS transistor 34, and the logic circuit 37a.

The nMOS transistor 35 has a drain coupled to the signal line through which the output signal OP propagates, a source coupled to a drain of the nMOS transistor 34, and a gate that receives the input signal DP or DM. The nMOS transistor 34 has a source coupled to a ground line and a gate that receives an output from the logic circuit 37a.

The logic circuit 37a is a first circuit example of the logic circuit 37c1. The logic circuit 37a includes pMOS transistors 371 and 374, nMOS transistors 372 and 373, and an inverter 375.

The inverter 375 generates an inverted logic signal of one of the digital signals SWP1 to SWPn.

A source of the pMOS transistor 371 receives the clock signal CLK and is coupled to a drain of the nMOS transistor 372. A drain of the pMOS transistor 371 is coupled to a source of the pMOS transistor 373, a drain of the nMOS transistor 374, and an output line outside the logic circuit 37a, and outputs a signal to the gate of the nMOS transistor 34. A gate of the pMOS transistor 371 receives the inverted logic signal of one of the digital signals SWP1 to SWPn and is coupled to a gate of the nMOS transistor 374.

A gate of the nMOS transistor 372 receives one of the digital signals SWP1 to SWPn and is coupled to a gate of the pMOS transistor 373.

A drain of the pMOS transistor 373 is coupled to the ground line and a source of the nMOS transistor 374.

When the logics of the digital signals SWP1 to SWPn are "L", the logic circuit 37a outputs a logic "L" signal, and when the logics of the digital signals SWP1 to SWPn are "H", the logic circuit 37a outputs a signal having the same logic as the clock signal CLK.

In a case in which the logic circuit 37a outputs a logic "L" signal, the nMOS transistor 34 is in the off state even when the potential of the node DP or DM is higher than or equal to a threshold of the nMOS transistor 35. Thus, the cancel current flowing from the output line of the output signal OP to the ground line is shut off. On the other hand, when the logic circuit 37a outputs a logic "H" signal and the potential of the node DP or DM is higher than or equal to the threshold of the nMOS transistor 35, the cancel current flows from the output line of the output signal OP to the ground line.

The logic circuit 37a is a circuit example of the logic circuits 37c1 to 37cn and is also a circuit example of the logic circuits 37dn, 37en, 47dn, and 47en. The logic circuit 37a is also a circuit example of the logic circuits 37fn, 37gn, 37hn, 47fn, 47gn, and 47hn.

Figure 16:
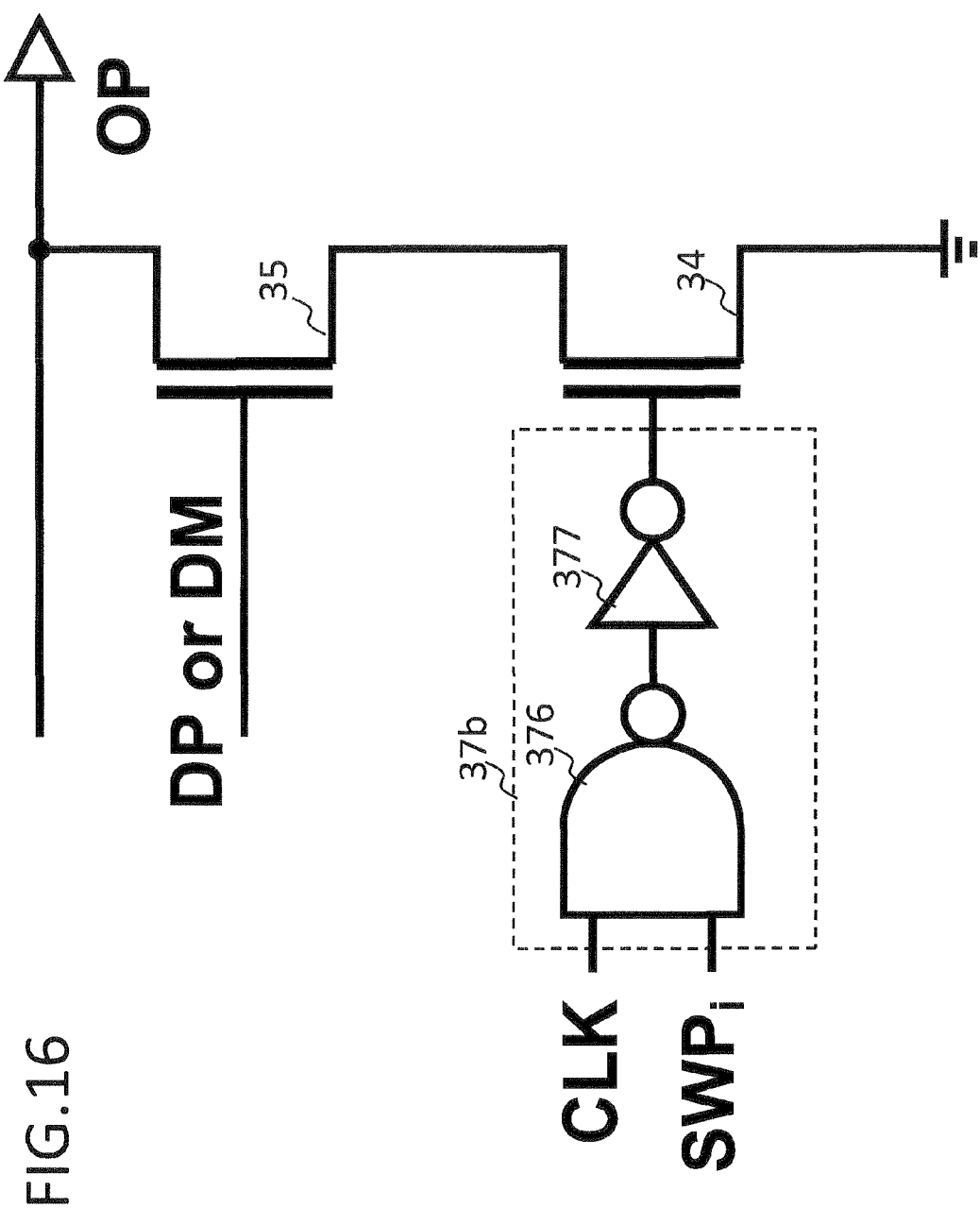
FIG. 16 is a diagram illustrating a logic circuit, which is a second circuit example of the logic circuit described in the fourth embodiment.

FIG. 16 is a diagram illustrating a logic circuit 37b, which is a second circuit example of the logic circuit 37c1 described in the fourth embodiment. FIG. 16 illustrates a signal line through which an output signal OP propagates, an nMOS transistor 35, an nMOS transistor 34, and the logic circuit 37b.

The nMOS transistor 35 has a drain coupled to the signal line through which the output signal OP propagates, a source coupled to a drain of the nMOS transistor 34, and a gate that receives the input signal DP or DM. The nMOS transistor 34 has a source coupled to a ground line and a gate that receives an output from the logic circuit 37b.

The logic circuit 37b is a circuit example of the logic circuit 37c1. The logic circuit 37b includes a NAND 376 and an inverter 377.

The NAND 376 has a first input that receives a clock signal CLK and a second input that receives one of the digital signals SWP1 to SWPn, performs a logical AND between the clock signal CLK and the signal of the second input, and outputs an inverted signal of the resulting logic.

When the logics of the digital signals SWP1 to SWPn are "L", the logic circuit 37b outputs a logic "L" signal, and when the logics of the digital signals SWP1 to SWPn are "H", the logic circuit 37b outputs a signal having the same logic as the clock signal CLK.

In a case in which the logic circuit 37b outputs a logic "L" signal, the nMOS transistor 34 is turned off even when the potential of the node DP or DM is higher than or equal to a threshold of the nMOS transistor 35. Thus, the cancel current flowing from the output line of the output signal OP to the ground line is shut off. On the other hand, when the logic circuit 37b outputs a logic "H" signal and the potential of the node DP or DM is higher than or equal to the threshold of the nMOS transistor 35, the cancel current flows from the output line of the output signal OP to the ground line.

The logic circuit 37b is a circuit example of the logic circuits 37c1 to 37cn and is also the logic circuits 37dn, 37en, 47cn, 47dn, and 47en. The logic circuit 37b is also a circuit example of the logic circuits 37fn, 37gn, 37hn, 47fn, 47gn, and 47hn. However, since the polarity of the transistors corresponding to the nMOS transistors 34 and 35 is a positive type, the logic circuit 37b does not request the inverter 377.

Figure 17:
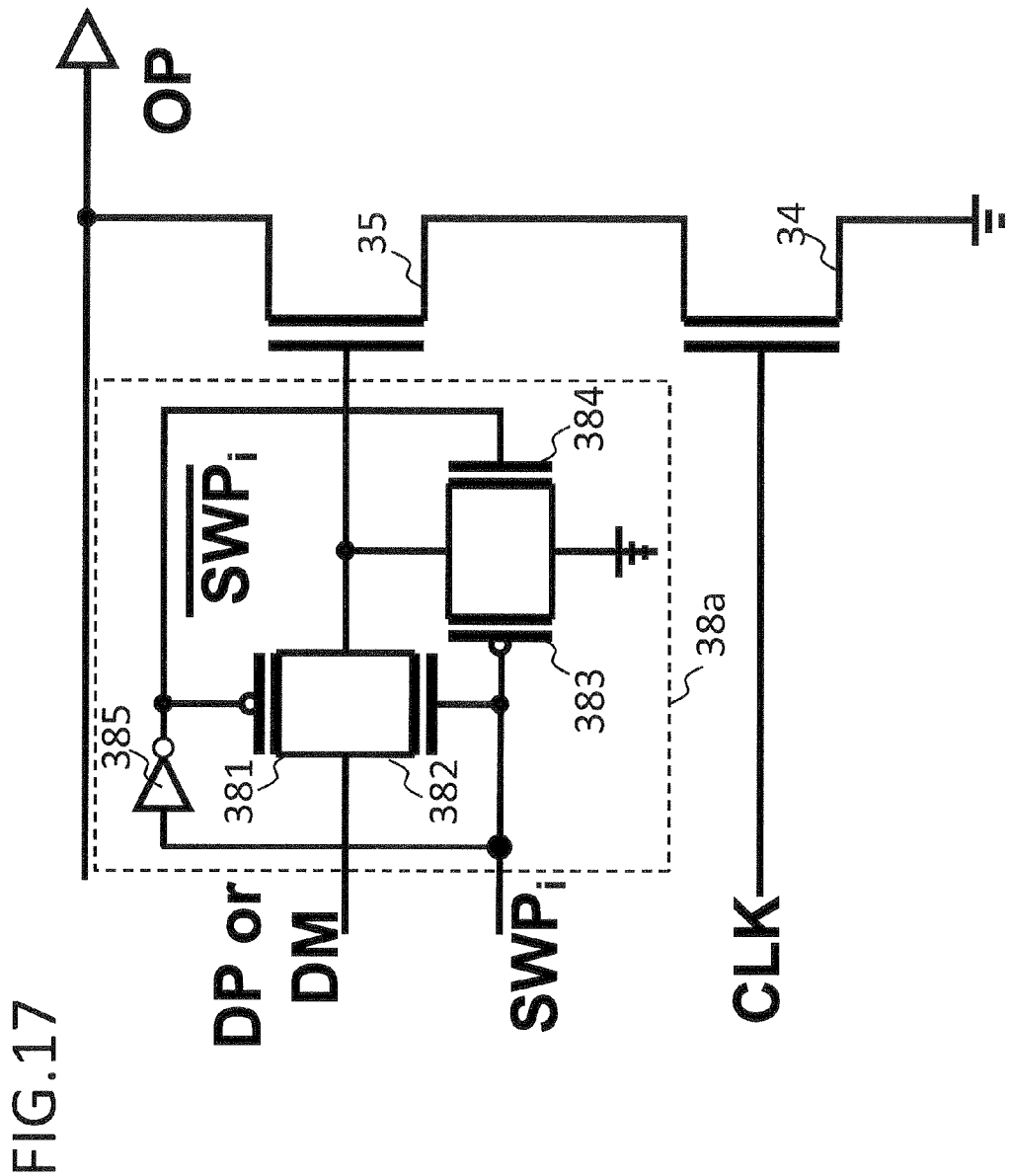
FIG. 17 is a diagram illustrating a logic circuit, which is a circuit example of a logic circuit described in the fourth embodiment.

FIG. 17 is a diagram illustrating a logic circuit 38a, which is a circuit example of the logic circuit 38c1 described in the fourth embodiment. FIG. 17 illustrates a signal line through which the output signal OP propagates, an nMOS transistor 35, an nMOS transistor 34, and the logic circuit 38a.

The nMOS transistor 35 has a drain coupled to the signal line through which the output signal OP propagates, a drain coupled to a drain of the nMOS transistor 34, and a gate that receives an output from the logic circuit 38a. The nMOS transistor 34 has a source coupled to a ground line and a gate that receives the clock signal CLK.

The logic circuit 38a is a circuit example of the logic circuit 38c1. The logic circuit 38a includes pMOS transistors 381 and 384, nMOS transistors 382 and 383, and an inverter 385.

The inverter 38*5* generates an inverted logic signal of one of the digital signals SWP1 to SWPn.

A source of the pMOS transistor 38*1* receives a signal from the node DM or DP and is coupled to a drain of the nMOS transistor 38*2*. A drain of the pMOS transistor 37*1* is coupled to a source of the pMOS transistor 38*3*, a drain of the nMOS transistor 38*4*, and an output line outside the logic circuit 38*a*, and outputs a signal to the gate of the nMOS transistor 35. A gate of the pMOS transistor 38*1* receives the inverted logic signal of one of the digital signals SWP1 to SWPn and is coupled to a gate of the nMOS transistor 38*4*.

A gate of the nMOS transistor 38*2* receives one of the digital signals SWP1 to SWPn and is coupled to a gate of the pMOS transistor 38*3*.

A drain of the pMOS transistor 38*3* is coupled to the ground line and a source of the nMOS transistor 38*4*.

When the logics of the digital signals SWP1 to SWPn are "L", the logic circuit 38*a* outputs a logic "L" signal, and when the logics of the digital signals SWP1 to SWPn are "H", the logic circuit 38*a* outputs a signal having a potential that is similar to that of the node DM or DR In a case in which the logic circuit 38*a* outputs a logic "L" signal, the nMOS transistor 35 is in the off state even when the potential of the clock signal CLK is higher than or equal to a threshold of the nMOS transistor 34. Thus, the cancel current flowing from the output line of the output signal OP to the ground line is shut off. On the other hand, when the logic circuit 38*a* outputs a logic "H" signal and the potential of the clock signal CLK is higher than or equal to the threshold of the nMOS transistor 34, the cancel current flows from the output line of the output signal OP to the ground line.

The logic circuit 38*a* is a circuit example of the logic circuit 38*c*1, is also a circuit example of the logic circuit 38*cn*, and is also a circuit example of the logic circuits 38*dn*, 38*en*, 38*fn*, 38*gn*, and 38*hn*. The logic circuit 38*a* is also a circuit example of the logic circuits 48*cn* and the logic circuit 48*dn*, 48*en*, 48*fn*, 48*gn*, and 48*hn*.

Figure 18:
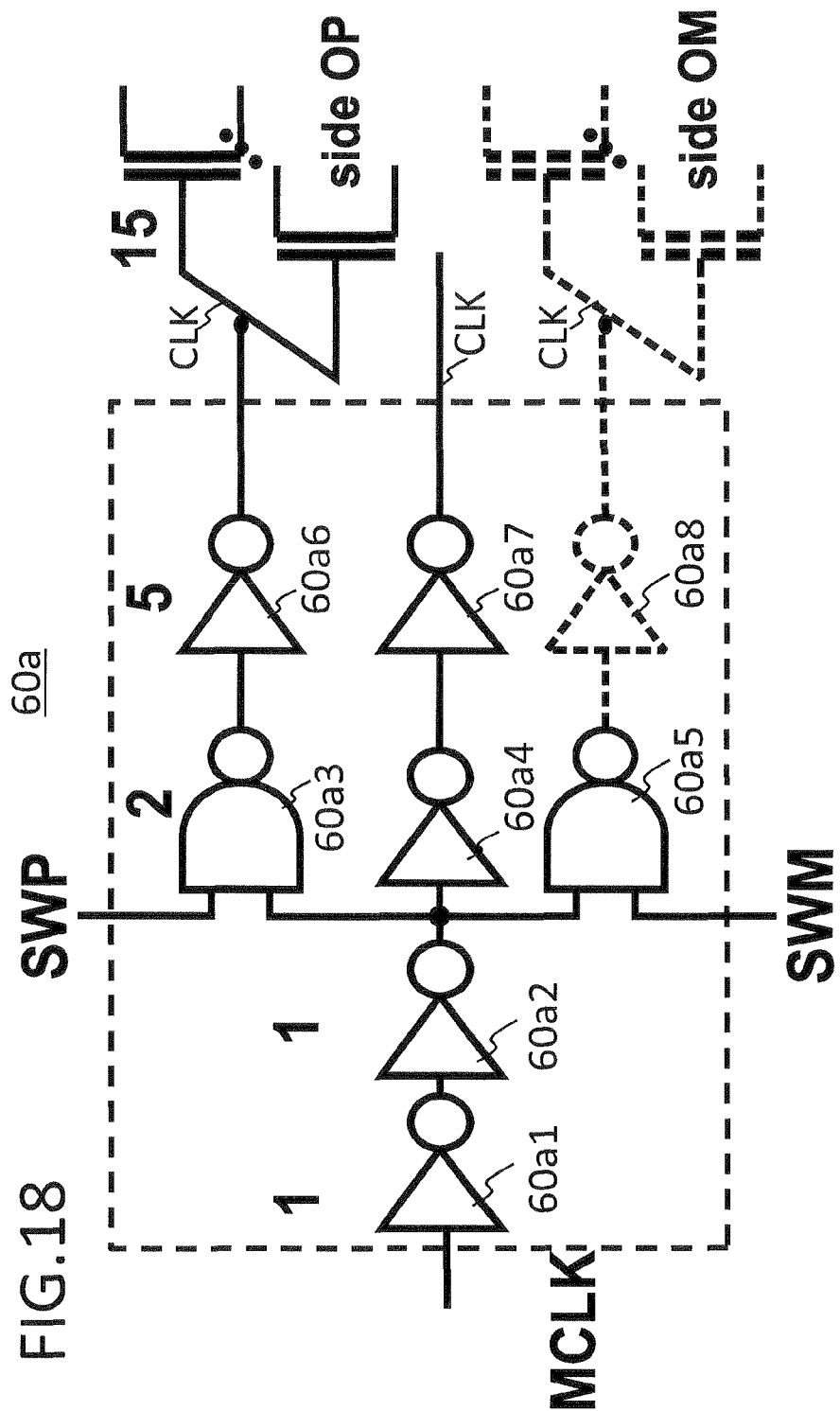
FIG. 18 is a circuit diagram of a clock buffer.

FIG. 18 is a circuit diagram of a clock buffer 60*a*. The clock buffer 60*a* includes an inverter 60*a*1, an inverter 60*a*2, a NAND 60*a*3, an inverter 60*a*4, a NAND 60*a*5, an inverter 60*a*6, an inverter 60*a*7, and an inverter 60*a*8.

The inverter 60*a*1 receives a main clock signal MCLK and outputs a first inverted signal to the inverter 60*a*2. Upon receiving the first inverted signal, the inverter 60*a*2 outputs a second inverted signal to one of terminals of the NAND 60*a*3, to the inverter 60*a*4, and to one of terminals of the NAND 60*a*5.

The NAND 60*a*3 receives a signal SWP via a second terminal of the NAND 60*a*3, performs a logical AND between the second inverted signal and the signal SWP, and outputs the resulting first logical-AND signal to the inverter 60*a*6. Upon receiving the first logical-AND signal, the inverter 60*a*6 outputs a clock signal CLK, which is an inverted signal of the first logical-AND signal, for the offset cancel units 30*c* to 30*h*.

The inverter 60*a*4 receives the second inverted signal and outputs a third inverted signal to the inverter 60*a*7. The inverter 60*a*7 receives the third inverted signal and outputs a clock signal CLK, which is an inverted signal thereof, for the switches 57*c* to 57*h*.

The NAND 60*a*5 receives a signal SWM via a second terminal of the NAND 60*a*5, performs a logical AND between the second inverted signal and the signal SWM, and outputs the resulting second logical-AND signal to the inverter 60*a*8. Upon receiving the second logical-AND signal, the inverter 60*a*8 outputs a clock signal CLK, which is an inverted signal of the second logical-AND signal, for the offset cancel units 40*c* to 40*h*.

The signal SWP and the signal SWM are output from any of the threshold controllers 20*c* to 20*h* and have logic levels as follows.

When the logic of any of the digital signals SWP1 to SWPn is "H", the logic of the signal SWP is "H", and when all of the logics of the digital signals SWP1 to SWPn are "L", the logic of the signal SWP is "L". When the logic of any of the digital signals SWM1 to SWMn is "H", the logic of the signal SWM is "H", and when all of the logics of the digital signals SWM1 to SWMn are "L", the logic of the signal SWM is "L". That is, when the logic of the signal SWP is "H", the logic of the signal SWM is "L", and when the logic of the signal SWM is "H", the logic of the signal SWP is "L".

When the logic of the signal SWP in the comparators 10*c* to 10*h* is "H", the clock signal CLK is supplied to the offset cancel units 30*c* to 30*h* whereas the clock signal CLK is not supplied to the offset cancel units 40*c* to 40*h*.

On the other hand, when the logic of the signal SWM is "H", the clock signal CLK is not supplied to the offset cancel units 30*c* to 30*h* and the clock signal CLK is supplied to the offset cancel units 40*c* to 40*h*.

Thus, in the comparators 10*c* to 10*h*, since the clock signal CLK supplied to the offset cancel units 30*c* to 30*h* or the clock signal CLK supplied to the offset cancel units 40*c* to 40*h* is shut off, the amount of power consumed by the comparators 10*c* to 10*h* is reduced compared to the amount of power consumed by the comparators 10 and 10*b*.

Figure 19:
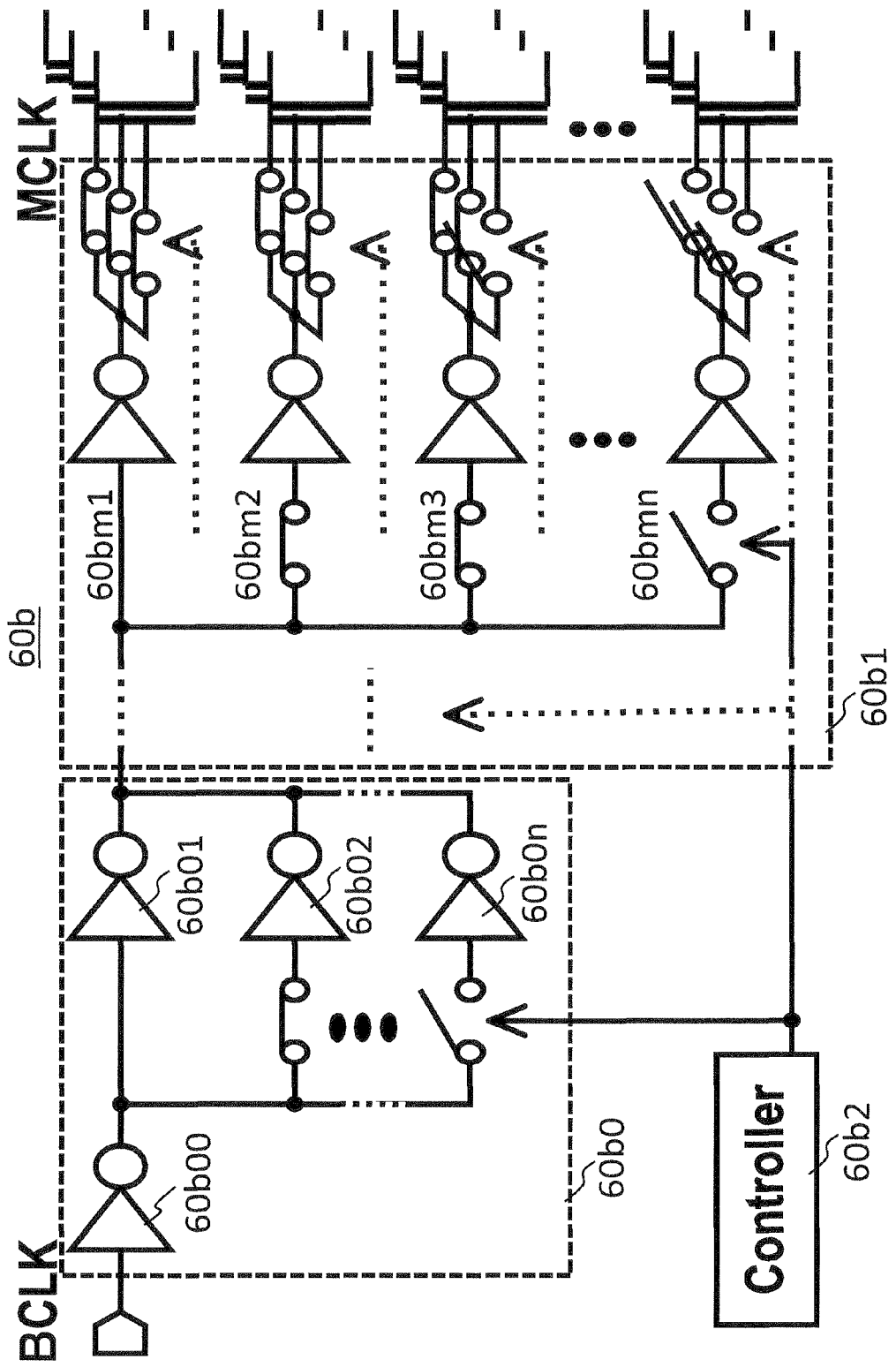
FIG. 19 is a circuit diagram of a clock buffer.

FIG. 19 is a circuit diagram of a clock buffer 60*b*. The clock buffer 60*b* includes a clock-drive-capability adjusting unit 60*b*0, a clock distributing unit 60*b*1, and a controller 60*b*2.

The controller 60*b*2 controls connection and shutoff of the switches included in the clock buffer 60*b*.

The clock-drive-capability adjusting unit 60*b*0 includes an inverter 60*b*00 that receives a reference clock BCLK, n switches, and n inverters 60*b*01 to 60*b*0n. The n switches are coupled in series with the inverters 60*b*01 to 60*b*0n, respectively, and one of the switches and a corresponding one of the inverters 60*b*01 to 60*b*0n constitute a set. The n sets are coupled in parallel between an output of the inverter 60*b*00 and the clock-drive-capability adjusting unit 60*b*0. The controller 60*b*2 controls the connection and shutoff of the n switches in accordance with the number of inverters operating in the clock distributing unit 60*b*1. That is, the drive capability of the clock-drive-capability adjusting unit 60*b*0 increases/decreases according to the number of inverters coupled to the output of the clock-drive-capability adjusting unit 60*b*0, and thus increases/decreases according to the number of connected switches.

The clock distributing unit 60*b*1 includes m×n inverters 60*b*11 to 60*bmn* and m×n switches coupled in series with the corresponding inverters. Each of the m×n inverters 60*b*11 to 60*bmn* supplies a main clock signal MCLK to m×n comparators (including the comparators 10*c* to 10*h*). The controller 60*b*2 executes connection and shutoff of the m×n switches in order to supply the main clock signal MCLK to the comparators (including the comparators 10*c* to 10*h*) determined to be operated.

As described in the third embodiment, the plurality of comparators (including the comparators 10*c* to 10*h*) are used in the analog-digital circuit and so on. However, the plurality of comparators (including the comparators 10*c* to 10*h*) are not necessarily simultaneously operated. Thus, it is sufficient for the main clock signal MCLK to be connected to only the comparators (including the comparator 10*c* to 10*h*) that operate. Accordingly, when the clock buffer 60b is adapted to connect the main clock signal MCLK to only the comparators (including the comparators 10c to 10h) that operate, it is possible to reduce the amount of power consumed by a semiconductor device provided with the analog-digital circuit and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying circuit comprising:
a pair of MOS transistors having gate electrodes that receive differential input signals;
an amplifier that is electrically coupled to drains of the pair of MOS transistors and a high-potential power-supply line to amplify a difference between potentials of differential output nodes electrically coupled to the corresponding drains of the pair of MOS transistors and to hold the amplified potential at the differential output nodes;
offset cancel circuits that cause cancel current to flow to one of the differential output nodes when the amplifier amplifies a voltage between the differential output nodes and that shut off, after the amplifier performs the amplification operation, inflow of the cancel current to the differential output node in accordance with voltages of the drains of the pair of MOS transistors; and
a threshold controller that performs setting so that a potential of a first one of the differential input signals is equal to a potential of another one of the differential input signals, that compares, before the inflow of the cancel current, potentials generated at the differential output nodes when the difference between the potentials of the differential output nodes is amplified, and that sets the cancel current so that the potentials are reversed after the inflow of the cancel current.

2. The amplifying circuit according to claim 1, wherein the offset cancel circuits comprises:
n switches having on/off states controlled by the threshold controller and having first terminals coupled to one of the differential output nodes; and
n first MOS transistors having drain terminals coupled to second terminals of the n switches, gate terminals coupled to one of the drains of the pair of MOS transistors, and source terminals that are settable at a ground potential.

3. The amplifying circuit according to claim 1, comprising:
n first logic circuits that output logic signals having logic levels according to logic levels of signals from the threshold controller and a logic level of a clock signal;
n first MOS transistors having drain terminals coupled to one of the differential output nodes and gate terminals coupled to one of the drains of the pair of MOS transistors; and
n second MOS transistors having drain terminals coupled to source terminals of the n first MOS transistors, gate terminals that receive the logic signals output from the n first logic circuits, and source terminals coupled to a ground line.

4. The amplifying circuit according to claim 1, comprising:
second logic circuits that output signals having potentials according to logic levels of signals from the threshold controller and one of potentials of the drains of the pair of MOS transistors;
n first MOS transistors having drain terminals coupled to one of the differential output nodes and gate terminals that receive the signals from the second logic circuits; and
n second MOS transistors having drain terminals coupled to corresponding source terminals of the n first MOS transistors, gate terminals that receive a clock signal, and source terminals coupled to a ground line.

5. The amplifying circuit according to claim 1, comprising:
n first logic circuits that output logic signals having logic levels according to logic levels of signals from the threshold controller and a logic level of a clock signal;
second logic circuits that output signals having potentials according to logic levels of signals from the threshold controller and one of potentials of the drains of the pair of MOS transistors;
n first MOS transistors having drain terminals coupled to one of the differential output nodes and having gate terminals that receive the signals from the second logic circuits; and
n second MOS transistors having drain terminals coupled to source terminals of the n first MOS transistors, gate terminals that receive the logic signals output from the n first logic circuits, and source terminals coupled to a ground line.

6. The amplifying circuit according to claim 1, wherein the threshold controller comprises:
a pulse counter that counts clock pulses in response to a clock signal;
a register that stores a count value output from the pulse counter; and
a decoder circuit that outputs, during calibration operation, a code signal corresponding to the count value output from the pulse counter and that outputs, during the amplification operation, a code signal corresponding to the counter value output from the register.

7. An analog-digital converter circuit comprising:
a series of resistors coupled in series between a reference power supply and a ground power supply;
comparators, each being coupled to one of connection points via which the resistors are coupled in series to compare a potential of an input signal with a potential of the connection point to which the corresponding comparator is coupled; and
an encoder that outputs a digital signal corresponding to the potential of the input signal, in accordance with comparison results output from the comparators;
wherein each comparator includes:
a pair of MOS transistors having gate electrodes that receive the potential of the input signal and the potential of the connection point;
an amplifier that is electrically coupled to drains of the pair of MOS transistors and a high-potential power-supply line to amplify a difference between potentials of differential output nodes electrically coupled to the corresponding drains of the pair of MOS transistors and to hold the amplified potential at the differential output nodes;

offset cancel circuits that cause cancel current to flow to one of the differential output nodes when the amplifier amplifies a voltage between the differential output nodes and that shut off, after the amplifier performs the amplification operation, inflow of the cancel current to the differential output node in accordance with voltages of the drains of the pair of MOS transistors; and a threshold controller that performs setting so that the potentials of the input signal and the connection point are equal to each other, that compares, before the inflow of the cancel current, potentials generated at the differential output nodes when the difference between the potentials of the differential output nodes is amplified, and that sets the cancel current so that the potentials are reversed after the inflow of the cancel current.

8. An amplifying circuit comprising:

a pair of MOS transistors having gate electrodes that receive differential input signals;

an amplifier that is electrically coupled to drains of the pair of MOS transistors and a ground line to amplify a difference between potentials of differential output nodes electrically coupled to the corresponding drains of the pair of MOS transistors and to hold the amplified potential at the differential output nodes;

offset cancel circuits that cause cancel current to flow to one of the differential output nodes when the amplifier amplifies a voltage between the differential output nodes and that shut off, after the amplifier performs the amplification operation, inflow of the cancel current to the differential output node in accordance with voltages of the drains of the pair of MOS transistors; and a threshold controller that performs setting so that potentials of first and second ones of the differential input signals are equal to each other, that compares, before the inflow of the cancel current, potentials generated at the differential output nodes when the difference between the potentials of the differential output nodes is amplified, and that sets the cancel current so that the potentials are reversed after the inflow of the cancel current.

9. The amplifying circuit according to claim 8, wherein the offset cancel circuits comprises:

n switches having on/off states controlled by the threshold controller and having first terminals coupled to one of the differential output nodes; and n first MOS transistors that have drain terminals coupled to second terminals of the n switches, gate terminals coupled to one of the drains of the pair of MOS transistors, and source terminals that are settable at a ground potential.

10. The amplifying circuit according to claim 8, comprising:

n first logic circuits that output logic signals having logic levels according to logic levels of signals from the threshold controller and a logic level of a clock signal;

n first MOS transistors having drain terminals coupled to one of the differential output nodes and gate terminals coupled to one of the drains of the pair of MOS transistors; and n second MOS transistors having drain terminals coupled to source terminals of the n first MOS transistors, gate terminals that receive the logic signals output from the n first logic circuits, and source terminals coupled to a high-potential line.

11. The amplifying circuit according to claim 8, comprising:

second logic circuits that output signals having potentials according to logic levels of signals from the threshold controller and one of potentials of the drains of the pair of MOS transistors;

n first MOS transistors having drain terminals coupled to one of the differential output nodes and gate terminals that receive the signals from the second logic circuits; and n second MOS transistors having drain terminals coupled to source terminals of the n first MOS transistors, gate terminals that receive a clock signal, and source terminals coupled to a high-potential line.

12. The amplifying circuit according to claim 8, comprising:

n first logic circuits that output logic signals having logic levels according to logic levels of signals from the threshold controller and a logic level of a clock signal;

second logic circuits that output signals having potentials according to logic levels of signals from the threshold controller and one of potentials of the drains of the pair of MOS transistors;

n first MOS transistors having drain terminals coupled to one of the differential output nodes and gate terminals that receive the signals from the second logic circuits; and n second MOS transistors having drain terminals coupled to source terminals of the n first MOS transistors, gate terminals that receive the logic signals output from the n first logic circuits, and source terminals coupled to a high-potential line.

* * * * *